(12) United States Patent
Koh et al.

(10) Patent No.: US 7,843,718 B2
(45) Date of Patent: Nov. 30, 2010

(54) NON-VOLATILE MEMORY DEVICES INCLUDING STACKED NAND-TYPE RESISTIVE MEMORY CELL STRINGS AND METHODS OF FABRICATING THE SAME

(75) Inventors: Gwan-Hyeob Koh, Seoul (KR);
Dae-Won Ha, Seoul (KR)

(73) Assignee: Samsung Electronics Co., Ltd. (KR)

( * ) Notice: Subject to any disclaimer, the term of this patent is extended or adjusted under 35 U.S.C. 154(b) by 154 days.

(21) Appl. No.: 12/178,962

(22) Filed: Jul. 24, 2008

(65) Prior Publication Data

US 2009/0027955 A1 Jan. 29, 2009

(30) Foreign Application Priority Data

Jul. 26, 2007 (KR) ........................ 10-2007-0075044

(51) Int. Cl.
*G11C 11/00* (2006.01)
*G11C 5/06* (2006.01)
*G11C 11/15* (2006.01)

(52) U.S. Cl. ..................... 365/148; 365/63; 365/158; 365/173

(58) Field of Classification Search ................. 365/148, 365/63, 158, 173
See application file for complete search history.

(56) References Cited

U.S. PATENT DOCUMENTS

| 6,898,122 B2* | 5/2005 | Pekny | 365/185.18 |
| 6,909,129 B2* | 6/2005 | Kim et al. | 257/295 |
| 2003/0026121 A1* | 2/2003 | Johnson et al. | 365/130 |
| 2004/0174732 A1* | 9/2004 | Morimoto | 365/148 |
| 2008/0112211 A1* | 5/2008 | Toda | 365/148 |
| 2008/0158936 A1* | 7/2008 | Bertin et al. | 365/148 |

FOREIGN PATENT DOCUMENTS

| JP | 2005-260014 | 9/2005 |
| KR | 1020030055390 A | 7/2003 |
| KR | 1020040079328 A | 9/2004 |

* cited by examiner

*Primary Examiner*—Ly D Pham
(74) *Attorney, Agent, or Firm*—Myers Bigel Sibley & Sajovec, P.A.

(57) ABSTRACT

A non-volatile memory device includes a substrate, an insulating layer on the substrate, and a plurality of serially connected resistive memory cells stacked in the insulating layer such that a first one of the plurality of resistive memory cells is on the substrate and a next one of the plurality of resistive memory cells is on the first one of the plurality of resistive memory cells to define a NAND-type resistive memory cell string. A bit line on the insulating layer is electrically connected to a last one of the plurality of resistive memory cells. At least one of the plurality of resistive memory cells may include a switching device and a data storage element including a variable resistor connected in parallel with the switching device. Related devices and fabrication methods are also discussed.

23 Claims, 15 Drawing Sheets

NON-VOLATILE MEMORY DEVICES INCLUDING STACKED NAND-TYPE RESISTIVE MEMORY CELL STRINGS AND METHODS OF FABRICATING THE SAME

CROSS-REFERENCE TO RELATED APPLICATION

This application claims priority from Korean Patent Application No. 10-2007-0075044, filed Jul. 26, 2007; the disclosure of which is hereby incorporated by reference herein in its entirety.

FIELD OF THE INVENTION

The present invention relates to semiconductor memory devices, and more particularly, to non-volatile memory devices and methods of fabricating the same.

BACKGROUND OF THE INVENTION

Semiconductor memory devices may be classified as volatile memory devices and non-volatile memory devices. Non-volatile memory devices may maintain the data stored therein even when power is cut off. Accordingly, non-volatile memory devices may be employed in computers, mobile telecommunication systems, memory cards, etc.

A flash memory device is one such non-volatile memory device. Memory cells having a stacked gate structure may be used in flash memory devices. The stacked gate structure may include a tunnel oxide layer, a floating gate, an inter-gate dielectric layer, and a control gate electrode, which may be sequentially stacked on a channel region. In order to increase reliability and/or program efficiency of the flash memory cell, the film quality of the tunnel oxide layer may be improved, and/or a coupling ratio of the cell may be increased.

Resistive memory devices have also been developed. Resistive memory devices may include magnetic random access memory (MRAM) devices, phase change memory devices, and/or resistive random access memory (RRAM) devices. A unit cell of a resistive memory device may include a data storage element having two electrodes and a variable resistor layer that is interposed therebetween. When the resistive memory device is a MRAM device, the variable resistor layer may include a pinned layer, a tunneling insulating layer, and a free layer, which may be sequentially stacked, and the tunneling insulating layer and the free layer may include a ferromagnetic layer. When the resistive memory device is a phase change memory device, the variable resistor layer may include a phase change material layer, such as a chalcogenide layer. When the resistive memory device is a RRAM device, the variable resistor layer may be a praseodymium calcium manganese oxide $((Pr,Ca)MnO_3)$ layer ("PCMO layer"). The variable resistor layer, i.e., the data storage material layer, may have a first resistance or a second resistance that is higher than the first resistance depending on polarity and/or magnitude of an electrical signal (voltage or current) that is applied between the electrodes.

For example, a RRAM device is disclosed in Korean Laid-Open Patent Publication No. 10-2004-79328 entitled "Non-Volatile Semiconductor Memory Device". According to the Korean Laid-Open Patent Publication, a plurality of NAND-type cell units may be connected in parallel to one bit line, and each of the NAND-type cell units may include a plurality of variable resistive devices that are serially connected to each other and a plurality of switching MOS transistors that are serially connected to each other. Each of the switching MOS transistors may be connected in parallel to one of the variable resistive devices. The switching MOS transistors may be one-dimensionally disposed on a semiconductor substrate, and the variable resistive devices may be provided on the MOS transistors. Therefore, improvements in device integration in conventional RRAM devices that use NAND-type cell units may be limited.

As another example, a phase change memory device is disclosed in Japanese Laid-Open Patent Publication No. 2005-260014 entitled "Semiconductor Device". According to the Japanese Laid-Open Patent Publication, a pair of phase change memory cells may be stacked on a semiconductor substrate, and a bit line may be interposed between the pair of phase change memory cells. That is, the pair of stacked phase change memory cells may share one bit line that is interposed therebetween. Consequently, the Japanese Laid-Open Patent Publication discloses a NOR-type phase change memory device.

SUMMARY OF THE INVENTION

According to some embodiments of the present invention, a NAND-type resistive memory cell string includes a bit line, and a plurality of serially connected resistive memory cells connected to the bit line. The plurality of resistive memory cells may include a first node, a second node, and a third node, a heater element connected between the first node and the second node, a variable resistor connected between the second node and the third node, and a switching device having a first terminal connected to the first node and a second terminal connected to the third node.

According to other embodiments of the present invention, a NAND-type resistive memory cell string includes a substrate, an insulating layer on the substrate, a plurality of serially connected resistive memory cells stacked in the insulating layer such that a first one of the plurality of resistive memory cells is on the substrate and a next one of the plurality of resistive memory cells is on the first one of the plurality of resistive memory cells, and a bit line on the insulating layer and electrically connected to a last one of the plurality of resistive memory cells.

According to further embodiments of the present invention, a method of fabricating a NAND-type resistive memory cell includes forming an insulating layer on a substrate. A plurality of serially connected resistive memory cells are formed stacked in the insulating layer such that a first one of the plurality of resistive memory cells is on the substrate and a next one of the plurality of resistive memory cells is on the first one of the plurality of resistive memory cells. A bit line is formed on the insulating layer and electrically connected to a last one of the plurality of resistive memory cells.

BRIEF DESCRIPTION OF THE DRAWINGS

FIGS. 6A to 13A are plan views illustrating methods of fabricating the NAND-type resistive memory cell string illustrated in FIG. 3.

FIGS. 6B to 13B are cross-sectional views illustrating methods of fabricating the NAND-type resistive memory cell string illustrated in FIG. 3.

DETAILED DESCRIPTION OF EMBODIMENTS OF THE INVENTION

Figure 1:
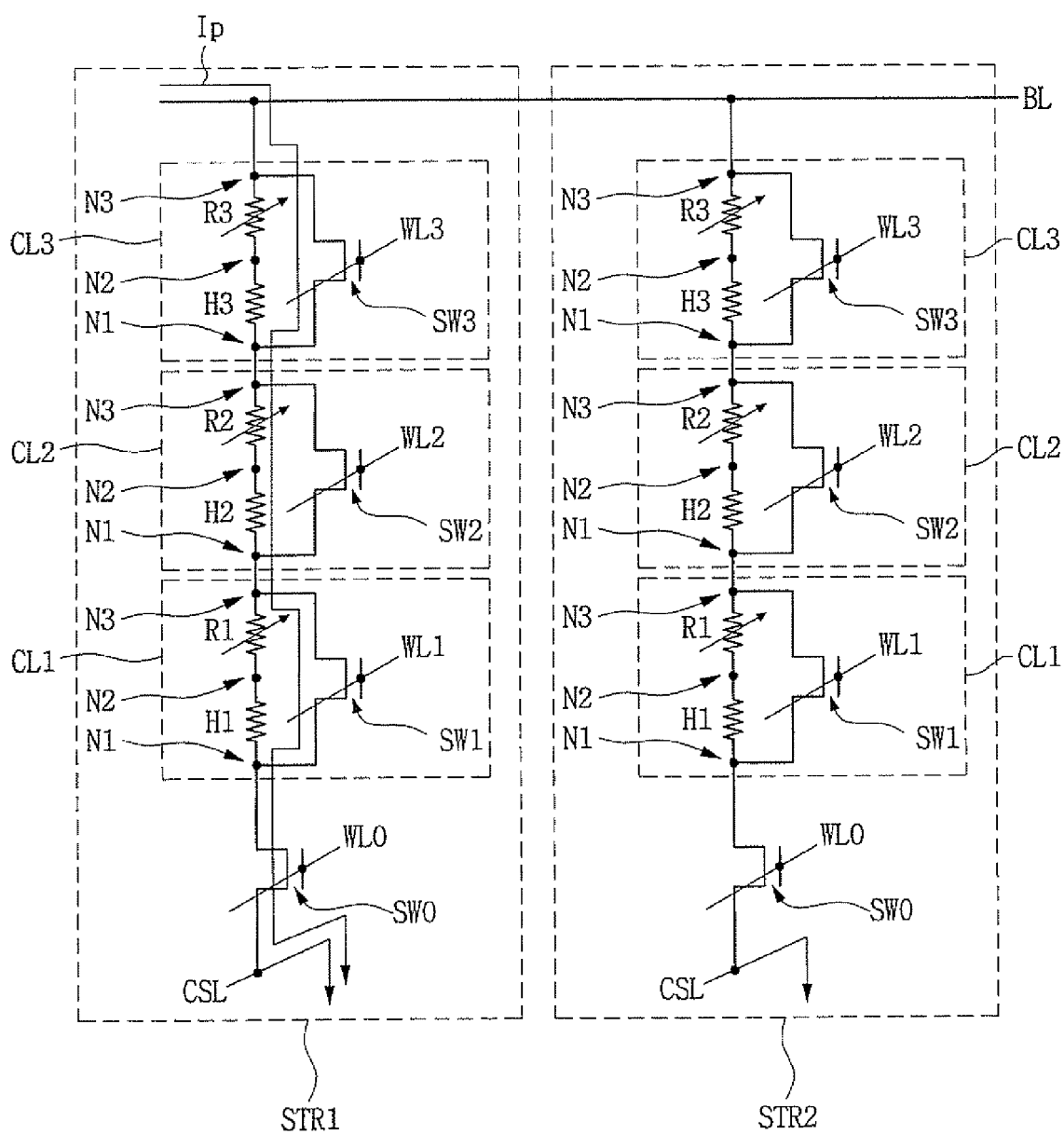
FIG. 1 is an equivalent circuit diagram illustrating NAND-type resistive memory cell strings according to some embodiments of the present invention.

The present invention will now be described more fully hereinafter with reference to the accompanying drawings, in which embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "bottom", "lower", "above", "top", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein.

FIG. 1 is an equivalent circuit diagram illustrating a part of a cell array block of a resistive memory device according to some embodiments of the present invention.

Referring to FIG. 1, first and a second NAND-type resistive memory cell strings STR1 and STR2 are provided. The first and the second NAND-type resistive memory cell strings STR1 and STR2 share one bit line BL. That is, the first and the second NAND-type resistive memory cell strings STR1 and STR2 are connected in parallel. As illustrated in FIG. 1, the first NAND-type resistive memory cell string STR1 has the same configuration as the second NAND-type resistive memory cell string STR2. Therefore, only one of the first and the second NAND-type resistive memory cell strings STR1 and STR2, e.g., only the first NAND-type resistive memory cell string STR1 will be described below.

The first NAND-type resistive memory cell string STR1 includes a plurality of resistive memory cells serially connected between the bit line BL and a main switching device SW0. As shown in FIG. 1, the first NAND-type resistive memory cell string STR1 includes first to third resistive memory cells CL1, CL2 and CL3, which are serially connected. However, the number of resistive memory cells comprising the NAND-type resistive memory cell string is not limited to three. For example, in some embodiments, a NAND-type resistive memory cell string may include two, four, or more serially-connected resistive memory cells. In some embodiments, the resistive memory cells CL1, CL2 and CL3 may be phase change memory cells. That is, the first, the second and the third resistive memory cells CL1, CL2 and CL3 may be a first, a second and a third phase change memory cells, respectively.

The main switching device SW0 may be a MOS transistor including a gate electrode, a source, and a drain. In this case, the source of the main switching device SW0 may be grounded through a common source line CSL, and the drain of the main switching device SW0 is electrically connected to the first phase change memory cell CL1. Also, the gate electrode of the main switching device SW0 may function as a main word line WL0 of the first NAND-type resistive memory cell string STR1.

The first phase change memory cell CL1 includes first, second and third nodes N1, N2 and N3, a first heater or heater element H1 connected between the first and the second nodes N1 and N2, a first variable resistor R1 having both ends respectively connected to the second and the third nodes N2 and N3, and a first switching device SW1 having first and second terminals that are respectively connected to the first and the third nodes N1 and N3. That is, the first heater H1 and the first variable resistor R1 are serially connected to each other, and the first switching device SW1 is connected in parallel to a first data storage element that includes the first heater H1 and the first variable resistor R1. The first switching device SW1 may be a MOS transistor that has a source, a drain, and a gate electrode. In this case, the source and the drain of the first switching device SW1 are respectively connected to the first and third nodes N1 and N3, and the gate electrode of the first switching device SW1 functions as a first word line WL1. Also, the first node N1 of the first phase change memory cell CL1 is connected to the drain of the main witching device SW0.

The second phase change memory cell CL2 also has a similar configuration as the first phase change memory cell CL1. That is, the second phase change memory cell CL2 includes first, second and third nodes N1, N2 and N3, a second heater H2 connected between the first and the second nodes N1 and N2, a second variable resistor R2 connected between the second and the third nodes N2 and N3, and a second switching device SW2 having first and second terminals that are respectively connected to the first and the third nodes N1 and N3. The second switching device SW2 may be a MOS transistor that has a source, a drain, and a gate electrode as well. The source and the drain of the second switching device SW2 are respectively connected to the first and the third nodes N1 and N3 of the second phase change memory cell CL2, and the gate electrode of the second switching device SW2 functions as a second word line WL2. Also, the first node N1 of the second phase change memory cell CL2 is connected to the third node N3 of the first phase change memory cell CL1.

The third phase change memory cell CL3 also has the same configuration as the first phase change memory cell CL1. That is, the third phase change memory cell CL3 includes first, second and third nodes N1, N2 and N3, a third heater H3 connected between the first and the second nodes N1 and N2, a third variable resistor R3 connected between the second and the third nodes N2 and N3, and a third switching device SW3 having first and second terminals that are respectively connected to the first and the third nodes N1 and N3. The third switching device SW3 may be a MOS transistor that has a source, a drain, and a gate electrode as well. The source and the drain of the third switching device SW3 are respectively connected to the first and the third nodes N1 and N3 of the third phase change memory cell CL3, and the gate electrode of the third switching device SW3 functions as a third word line WL3. Further, the first and the third nodes N1 and N3 of the third phase change memory cell CL3 are respectively connected to the third node N3 of the second phase change memory cell CL2 and the bit line BL. The first to the third variable resistors R1 to R3 may be phase change material layers.

Operations of the first and the second NAND-type resistive memory cell strings STR1 and STR2 will be described below. A "first string" represents the first NAND-type resistive memory cell string STR1, and a "second string" represents the second NAND-type resistive memory cell string STR2. Also, "first cell", "second cell" and "third cell" represent the first, the second and the third resistive memory cells CL1, CL2 and CL3, respectively.

First, a method of selectively programming one of a plurality of cells CL1, CL2, and CL3 comprising the first and the second strings ST1 and ST2 illustrated in FIG. 1 will be described. The programming method includes selecting one of the first and the second strings ST1 and ST2, selecting one of the plurality cells CL1, CL2 and CL3 comprising the selected strings, and applying a program signal to the selected cell. For example, the selected cell may be the second cell CL2 among the first to the third cells CL1 to CL3 comprising the first string STR1. In this case, the programming method may include selecting the first string STR1, selecting a second cell CL2 of the first string STR1, and applying a program signal to the selected second cell CL2.

The first string STR1 may be selected by turning on the main switching device SW0, and the second cell CL2 of the first string STR1 may be selected by turning off the second switching device SW2 comprising the first string STR1. While the second cell CL2 of the first string STR1 is selected, the second string STR2 may remain unselected by turning off the main switching device SW0 of the second string STR2, and the first and the third cells CL1 and CL3 of the first string STR1 may remain unselected by turning on the first and the third switching devices SW1 and SW3 comprising the first string STR1. Further, the program signal may be applied by applying a program current $I_P$ to the bit line BL connected to the selected string, i.e., the first string STR1.

In the program mode, as illustrated in FIG. 1, the program current $I_P$ flows to a ground terminal through the third switching device SW3, the second variable resistor R2, a second heater H2, the first switching device SW1, and the main switching device SW0, which define the first string STR1. That is, the program current $I_P$ flows to the ground terminal through only the second variable resistor R2 and the second heater H2 of the selected second cell CL2 among the first to the third cells CL1 to CL3 of the first string STR1. Accordingly, the second heater H2 generates joule-heat while the program current $I_P$ flows, and the joule-heat may cause the selected second variable resistor R2 to be changed to have a first resistance or a second resistance that is higher than the first resistance.

A method of selectively reading data stored in the second cell CL2 of the first string STR1 illustrated in FIG. 1 will be described below. The read method may include selecting the first string STR1, selecting the second cell CL2 of the first string STR1, and applying a read signal to the selected second cell CL2.

The first string STR1 and the second cell CL2 of the first string STR1 may be selected using the same method described in the program mode. Also, the read signal may be provided by applying a read voltage to the bit line BL connected to the selected string, i.e., the first string STR1.

When the read voltage is applied to the selected bit line BL, the voltage induced to the selected bit line BL (or the current that flows through the selected bit line BL) may depend on the electrical resistance of a variable resistor of the selected cell (i.e., the second variable resistor R2 of the second cell CL2 of the first string STR1). Therefore, a sense amplifier (not shown) senses the voltage which is induced to the selected bit line BL (or the current that flows through the selected bit line BL). And the data stored in the selected cell may be read.

During the above-described read mode, the read current that flows through the variable resistor and the heater of the selected cell should be less than the program current $I_P$ to prevent the selected cell from being programmed.

Figure 2:
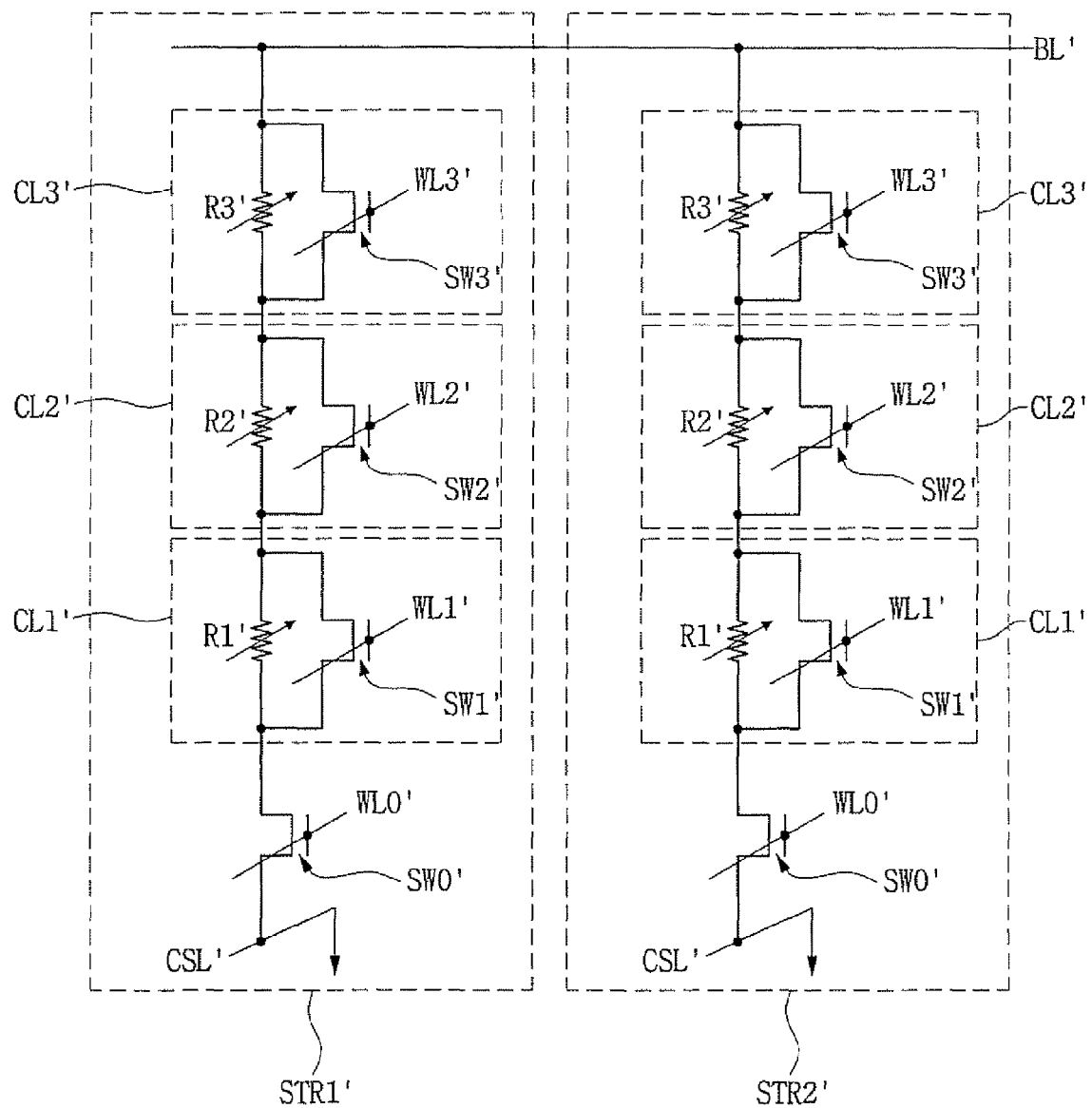
FIG. 2 is an equivalent circuit diagram illustrating NAND-type resistive memory cell strings according to other embodiments of the present invention.

FIG. 2 is an equivalent circuit diagram illustrating a part of a cell array block of a resistive memory device according to other embodiments of the present invention.

Referring to FIG. 2, a first and a second NAND-type resistive memory cell strings STR1' and STR2' are provided, and the first and the second NAND-type resistive memory cell strings STR1' and STR2' share one bit line BL as in the embodiment described with reference to FIG. 1. That is, the first and the second NAND-type resistive memory cell strings STR1' and STR2' are connected. As illustrated in FIG. 2, the first NAND-type resistive memory cell strings STR1' has the same configuration as the second NAND-type resistive memory cell strings STR2'. Each of the first and the second NAND-type resistive memory cell strings STR1' and STR2' has a similar configuration to the first or the second NAND-type resistive memory cell string STR1 or STR2 described with reference to FIG. 1. That is, each of the first and the second NAND-type resistive memory cell strings STR1' and STR2' includes a plurality of resistive memory cells CL1', CL2' and CL3', and a main switching device SW0', which are serially connected to the bit line BL'.

In the embodiment of FIG. 2, the resistive memory cells CL1', CL2' and CL3' are different from those of FIG. 1. That is, the first resistive memory cell CL1' according to the present embodiment includes a first variable resistor R1' and a first switching device SW1', which are connected in parallel to each other as illustrated in FIG. 2. The second and the third resistive memory cells CL2' and CL3' have the same configuration as the first resistive memory cell CL1'. In other words, the second resistive memory cell CL2' also includes a second variable resistor R2' and a second switching device SW2', which are connected in parallel to each other, and the third resistive memory cell CL3' includes a third variable resistor R3' and a third switching device SW3', which are connected in parallel to each other as well.

In the embodiment of FIG. 2, the resistive memory cells CL1', CL2' and CL3' may be resistive random access memory (RRAM) cells or magnetic random access memory (MRAM) cells. That is, the first, the second and the third resistive memory cells CL1', CL2' and CL3' may be first, second and third RRAM cells or first, second and third MRAM cells, respectively.

The first and the second NAND-type resistive memory cell strings STR1' and STR2' may be driven using the same program and read methods as those described with reference to FIG. 1. In the embodiment of FIG. 2, in the case where the resistive memory cells CL1', CL2' and CL3' are MRAM cells, the MRAM cells may not include a digit line. Therefore, MRAM cells of the NAND-type MRAM cell strings according to the present exemplary embodiment may be programmed using a spin injection mechanism, for example, as disclosed in U.S. Pat. No. 7,164,598.

Figure 3:
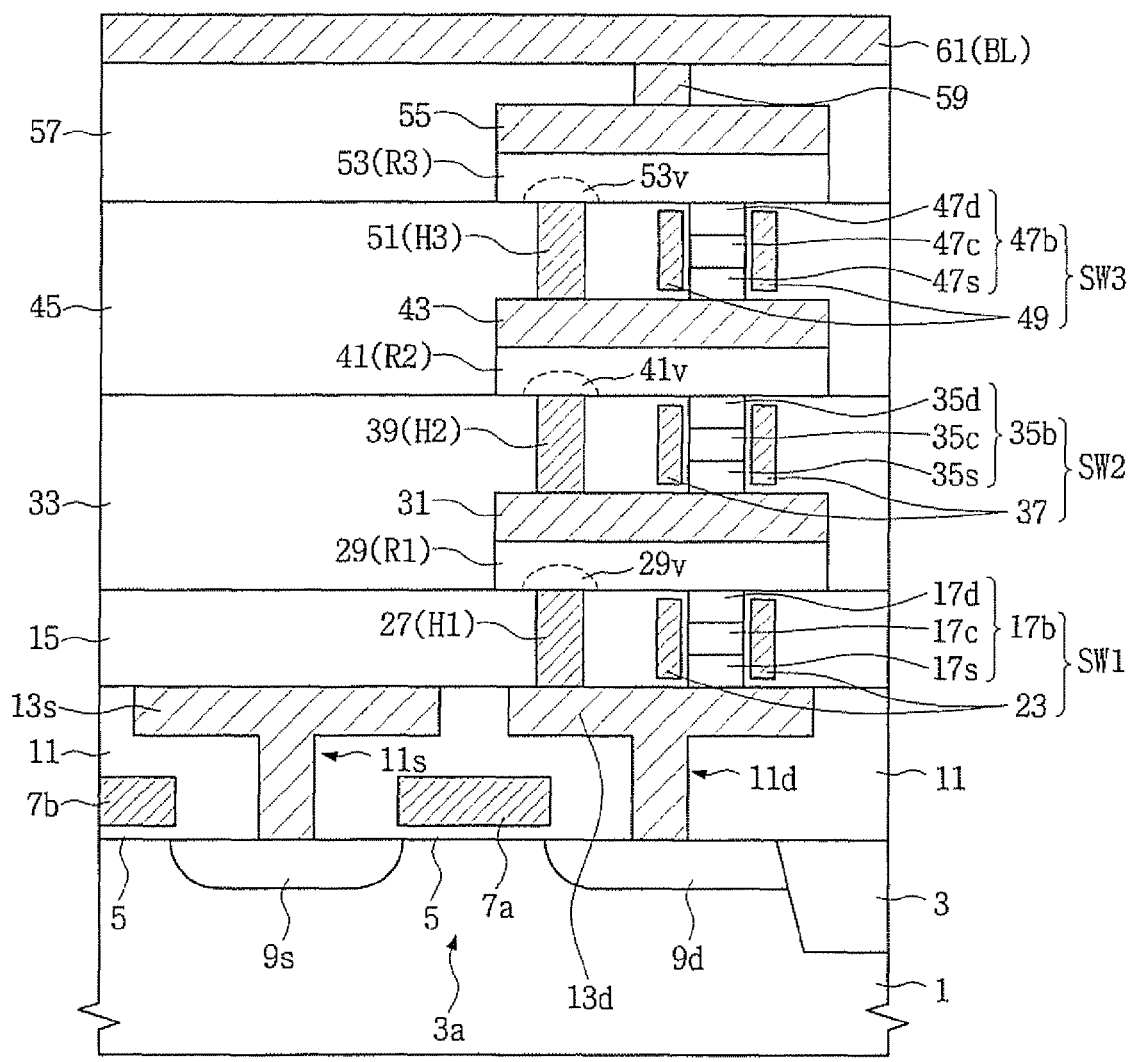
FIG. 3 is a cross-sectional view of a NAND-type resistive memory cell string having an equivalent circuit diagram as shown in FIG. 1.

FIG. 3 is a cross-sectional view of a NAND-type resistive memory cell string having the equivalent circuit diagram as shown in FIG. 1.

Referring to FIG. 3, an isolation layer 3 is provided in a predetermined region of a semiconductor substrate 1 to define an active region 3a. A main source region 9s and a main drain region 9d are disposed in the active region 3a, and a main gate electrode 7a is disposed on a channel region between the main source 9s and the main drain 9d. The main gate electrode 7a is insulated from the channel region by a gate insulating layer 5. The main gate electrode 7a may extend to cross (i.e., substantially perpendicular to) the active region 3a, and may function as a main word line (corresponding to WL0 of FIG. 1). Another main gate electrode 7b may be disposed over the active region 3a adjacent to the main source 9s. That is, the main source 9s may be disposed in the active region between the main gate electrodes 7a and 7b. The main gate electrode 7a, the main source 9s, and the main drain 9d define a main switching device (corresponding to SW0 of FIG. 1).

A lower insulating layer 11 is formed on the main switching device 9s, 9d and 7a and the isolation layer 3. A common source line 13s and a drain pad 13d may be provided in the lower insulating layer 11. The common source line 13s may be disposed in parallel to the main word line 7a. The common source line 13s and the drain pad 13d are electrically connected to the main source 9s and the main drain 9d through a source contact hole 11s and a drain contact hole 11d, which pass through the lower insulating layer 11, respectively.

A first insulating layer 15 is disposed on the common source line 13s, the drain pad 13d and the lower insulating layer 11, and a first switching device SW1 is disposed in the first insulating layer 15. The first switching device SW1 includes a first body pattern 17b extending through the first insulating layer 15 and a first gate electrode 23 surrounding the first body pattern 17b. The first body pattern 17b includes a first source 17s, a first channel 17c, and a first drain 17d, which are vertically stacked in sequence. The first gate electrode 23 is on side walls of the first channel 17c, and the first channel 17c is electrically connected to the drain pad 13d. Consequently, the first switching device SW1 may be a vertical type MOS transistor. The first gate electrode 23 extends parallel to the main word line 7a and functions as a first word line (WL1 of FIG. 1).

A first lower electrode 27 (corresponding to the first heater H1 of FIG. 1) is disposed in the first insulating layer 15 adjacent to the first switching device SW1. The first lower electrode 27 is electrically connected to the drain pad 13d. A first phase change material pattern 29 (corresponding to the first variable resistor R1 of FIG. 1), is formed on an upper surface of the first lower electrode 27 and an upper surface of the first drain 17d, and a first upper electrode 31 is stacked on the first phase change material pattern 29. The first lower electrode 27, the first phase change material pattern 29, and the first upper electrode 31 define a first data storage element. The first phase change material pattern 29 generally exhibits an initial crystalline state, but is configured to translation to an amorphous state responsive to heat applied thereto. The first switching device SW1 and the first data storage element 27, 29 and 31 define a first resistive memory cell (corresponding to CL1 of FIG. 1), i.e., a first phase change memory cell.

A second insulating layer 33 is provided on the first upper electrode 31 and the first insulating layer 15. A second switching device SW2 having the same configuration as the first switching device SW1 is disposed in the second insulating layer 33. That is, the second switching device SW2 includes a second body pattern 35b extending through the second insulating layer 33 to be in contact with the first upper electrode 31 and a second gate electrode 37 on side walls of the second body pattern 35b. The second body pattern 35b includes a second source 35s, a second channel 35c, and a second drain 35d, which are sequentially stacked. The second gate electrode 37 may extend parallel to the first gate electrode 23 and function as a second word line (corresponding to WL2 of FIG. 1).

A second data storage element is disposed to be adjacent to the second switching device SW2. The second data storage element may have the same configuration as the first data storage element. That is, the second data storage element may include a second lower electrode 39 (corresponding to the second heater H2 of FIG. 1) extending through the second insulating layer 33 to be electrically connected to the first upper electrode 31, a second phase change material pattern 41 (corresponding to the second variable resistor R2 of FIG. 1) on the second lower electrode 39 and the second drain 35d, and a second upper electrode 43 on the second phase change material pattern 41. The second phase change material pattern 41 has an initial crystalline state as well. The second switching device SW2 and the second data storage element 39, 41 and 43 define a second resistive memory cell (corresponding to CL2 of FIG. 1), i.e., a second phase change memory cell.

A third insulating layer 45 is provided on the second upper electrode 43 and the second insulating layer 33. A third switching device SW3 having the same configuration as the first switching device SW1 is disposed in the third insulating layer 45. That is, the third switching device SW3 includes a third body pattern 47b extending through the third insulating layer 45 to be in contact with the second upper electrode 43 and a third gate electrode 49 on side walls of the third body pattern 47b. The third body pattern 47b includes a third source 47s, a third channel 47c, and a third drain 47d, which are sequentially stacked. The third gate electrode 49 may extend parallel to the first word line 23 and may function as a third word line (corresponding to WL3 of FIG. 1).

A third data storage element is disposed to be adjacent to the third switching device SW3. The third data storage element may have the same configuration as the first data storage element. That is, the third data storage element may include a third lower electrode 51 (corresponding to the third heater H3 of FIG. 1) extending through the third insulating layer 45 to be electrically connected to the second upper electrode 43, a third phase change material pattern 53 (corresponding to the third resistive material R3 of FIG. 1) on the third lower electrode 51 and the third drain 47d, and a third upper electrode 55 on the third phase change material pattern 53. The third phase change material pattern 53 has an initial crystalline state as well. The third switching device SW3 and the third data storage element 51, 53 and 55 define a third resistive memory cell (corresponding to the CL3 of FIG. 1), i.e., a third phase change memory cell.

An upper insulating layer 57 is disposed on the third upper electrode 55 and the third insulating layer 45, and a bit line 61 (corresponding to BL of FIG. 1) is disposed on the upper insulating layer 57. The bit line 61 may be electrically connected to the third upper electrode 55 through a bit line contact plug 59 extending through the upper insulating layer 57. The bit line 61 may be disposed to cross the main word line 7a.

Consequently, the NAND-type resistive memory cell string according to the embodiment of FIG. 3 includes a main switching device formed on a semiconductor substrate 1, a plurality of resistive memory cells that are sequentially stacked on the main switching device such that the upper electrode of a first one of the plurality of resistive memory cells is on the lower electrode and the body pattern of a next one of the plurality of resistive memory cells, and a bit line that is electrically connected to a last one of the plurality of resistive memory cells. The main switching device is electrically connected to the first one of the plurality of resistive memory cells, and the plurality of stacked resistive memory cells are serially connected to each other.

One of the first to the third resistive memory cells illustrated in FIG. 3 may be selectively programmed or read using the same method as described above with reference to FIG. 1. Therefore, operations of the NAND-type resistive memory cell string according to the embodiment of FIG. 3 will not be further described.

When the first resistive memory cell is selectively programmed, joule-heat is generated at an interface between the first phase change material pattern 29 and the first lower electrode 27, so that the first phase change material pattern 29 (i.e., a first phase change region 29v adjacent to an upper surface of the first lower electrode 27) may be at least partially changed into a crystalline state or an amorphous state. Accordingly, the first phase change material pattern 29 may transition between a first resistance or a second resistance higher than the first resistance, depending on whether the pattern 29 is in the crystalline state or the amorphous state. Similarly, when the second resistive memory cell is selectively programmed, the second phase change material pattern 41 (i.e., a second phase change region 41v adjacent to an upper surface of the second lower electrode 39) may be at least partially changed into a crystalline state or an amorphous state, and when the third resistive memory cell is selectively programmed, the third phase change material pattern 53 (i.e., a third phase change region 53v adjacent to an upper surface of the third lower electrode 51) may be at least partially changed into a crystalline state or an amorphous state.

Figure 4:
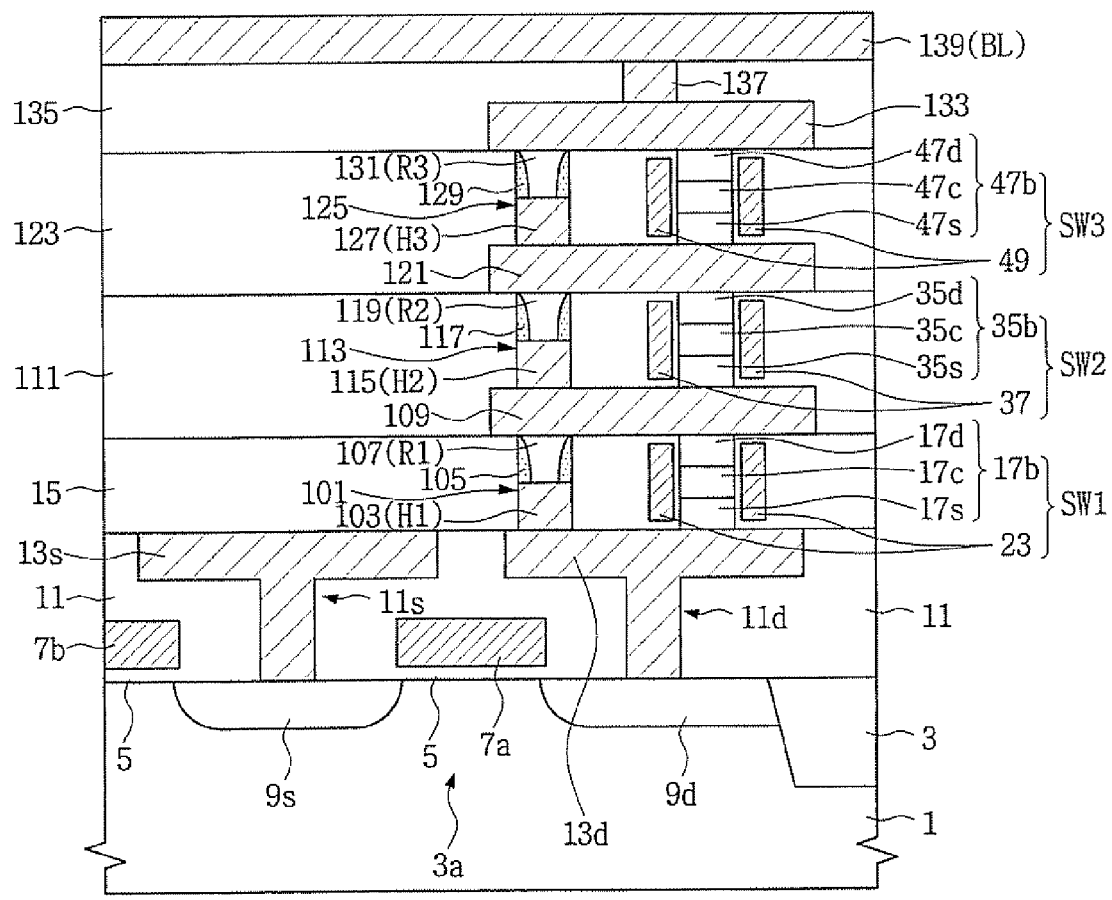
FIG. 4 is a cross-sectional view of another NAND-type resistive memory cell string having an equivalent circuit diagram as shown in FIG. 1.

FIG. 4 is a cross-sectional view of another NAND-type resistive memory cell string having the equivalent circuit diagram as shown in FIG. 1. The embodiment of FIG. 4 is different from that of FIG. 3 in terms of the type of data storage element.

Referring to FIG. 4, a main switching device 7a, 9s and 9d, a lower insulating layer 11, a drain pad 13d, and a common source line 13s, which are in the same configuration as illustrated in FIG. 3, are provided on a semiconductor substrate 1. A first insulating layer 15 is disposed on the lower insulating layer 11, the drain pad 13d, and the common source line 13s, and a first switching device SW1 in the same configuration as that illustrated in FIG. 3 is disposed in the first insulating layer 15. The drain pad 13d is exposed by a first hole 101 passing through the first insulating layer 15, and a first lower electrode 103 (corresponding to the first heater H1 of FIG. 1) is disposed in the first hole 101. The first lower electrode 103 may be recessed to have an upper surface lower than that of the first insulating layer 15. The first hole 101 of the first lower electrode 103 may be filled with a first phase change material pattern 107 (corresponding to a first variable resistor R1 of FIG. 1). In addition, a first insulating spacer 105 may be interposed between a sidewall of the first phase change material pattern 107 and the first insulating layer 15. That is, in the embodiment of FIG. 4, the first phase change material pattern 107 may be self-aligned with the first lower electrode 103. In other words, the first phase change material pattern 107 may have a shape defined by the spacer 105 on sidewalls of the first hole 101. A first upper electrode 109 is formed on the first phase change material pattern 107 and the first drain 17d. The first lower electrode 103, the first phase change material pattern 107, and the first upper electrode 109 define a first data storage element. The first switching device SW1 and the first data storage element 103, 107 and 109 define a first resistive memory cell (corresponding to CL1 of FIG. 1), i.e., a first phase change memory cell.

As illustrated in FIG. 4, the first upper electrode 109 may be in contact with an upper surface of the first drain 17d. Accordingly, as compared with the embodiment of FIG. 3, a parasitic electrical resistance between the first upper electrode 109 and the first switching device SW1 may be considerably reduced. In particular, while there is the first phase change material pattern 29 extends between the first upper electrode 31 and the first switching device SW1 in the exemplary embodiment of FIG. 3, no such resistive material layer extends between the first upper electrode 109 and the first switching device SW1 in the embodiment of FIG. 4.

A second insulating layer 111 is disposed on the first insulating layer 15 and the first upper electrode 109. A second switching device SW2 having the same configuration as that illustrated in FIG. 3 is disposed in the second insulating layer 111. Also, a second data storage element having the same configuration as the first data storage element 103, 107 and 109 is disposed in the second insulating layer 111. That is, the second data storage element may include a second lower electrode 115 (corresponding to the second heater H2 of FIG. 1) passing through the second insulating layer 111 and electrically connected to the first upper electrode 109, a second phase change material pattern 119 on the second lower electrode 115 (corresponding to the second variable material RS of FIG. 1), and a second upper electrode 121 on the second phase change material pattern 119 and the second drain 35d. A second insulating spacer 117 may be interposed between a sidewall of the second phase change material pattern 119 and the second insulating layer 111. As illustrated in FIG. 4, the second upper electrode 121 may be in direct contact with an upper surface of the second upper drain 35d. The second switching device SW2 and the second data storage element 115, 119 and 121 define a second resistive memory cell (corresponding to CL2 of FIG. 1), i.e., a second phase change memory cell.

A third insulating layer 123 is disposed on the second insulating layer 111 and the second upper electrode 121, and a third switching device SW3 having the same configuration as that illustrated in FIG. 3 is disposed in the third insulating layer 123. Also, a third data storage element having the same configuration as the first data storage element 103, 107 and 109 is disposed in the third insulating layer 123. That is, the third data storage element may include a third lower electrode 127 (corresponding to the third heater H3 of FIG. 1) passing through the third insulating layer 123 and electrically connected to the second upper electrode 121, a third phase change material pattern 131 on the third lower electrode 127 (corresponding to the third variable resistor R3 of FIG. 1) and a third upper electrode 133 on the third phase change material pattern 131 and the third drain 47d. A third insulating spacer 129 may be interposed between a sidewall of the third phase change material pattern 131 and the third insulating layer 123. As illustrated in FIG. 4, the third upper electrode 133 may be in direct contact with an upper surface of the third drain 47d. The third switching device SW3 and the third data storage element 127, 131 and 133 define a third resistive memory cell (corresponding to CL3 of FIG. 1), i.e., a third phase change memory cell.

An upper insulating layer 135 is disposed on the third upper electrode 133 and the third insulating layer 123, and a bit line 139 (corresponding to BL of FIG. 1) is disposed on the upper insulating layer 135. The bit line 139 may be electrically connected to the third upper electrode 133 through a bit line contact plug 137 passing through the upper insulating layer 135. The bit line 139 may be disposed to cross the main word line 7a.

The first to the third resistive memory cells illustrated in FIG. 4 may be selectively programmed or read using the same methods described with reference to FIG. 1. Therefore, further operations of the NAND-type resistive memory cell string according to the embodiment of FIG. 4 will be not be described further hereinafter.

According to the embodiment of FIG. 4, the first to third upper electrodes 109, 121 and 133 may be in direct contact with the first to third drains 17d, 35d and 47d, respectively, as described above. Accordingly, a parasitic electrical resistance between the upper electrodes 109, 121 and 133 and the switching devices SW1, SW2 and SW3 may be considerably reduced as compared with the exemplary embodiment of FIG. 3. When the parasitic resistance is reduced, current that flows through a resistive memory cell switching device that is not selected may be increased, and this may result in suppressing soft programming of a data storage element of the resistive memory cell that is not selected. In addition, when the parasitic electrical resistance is reduced, a sensing margin of the sense amplifier may be increased.

Figure 5:
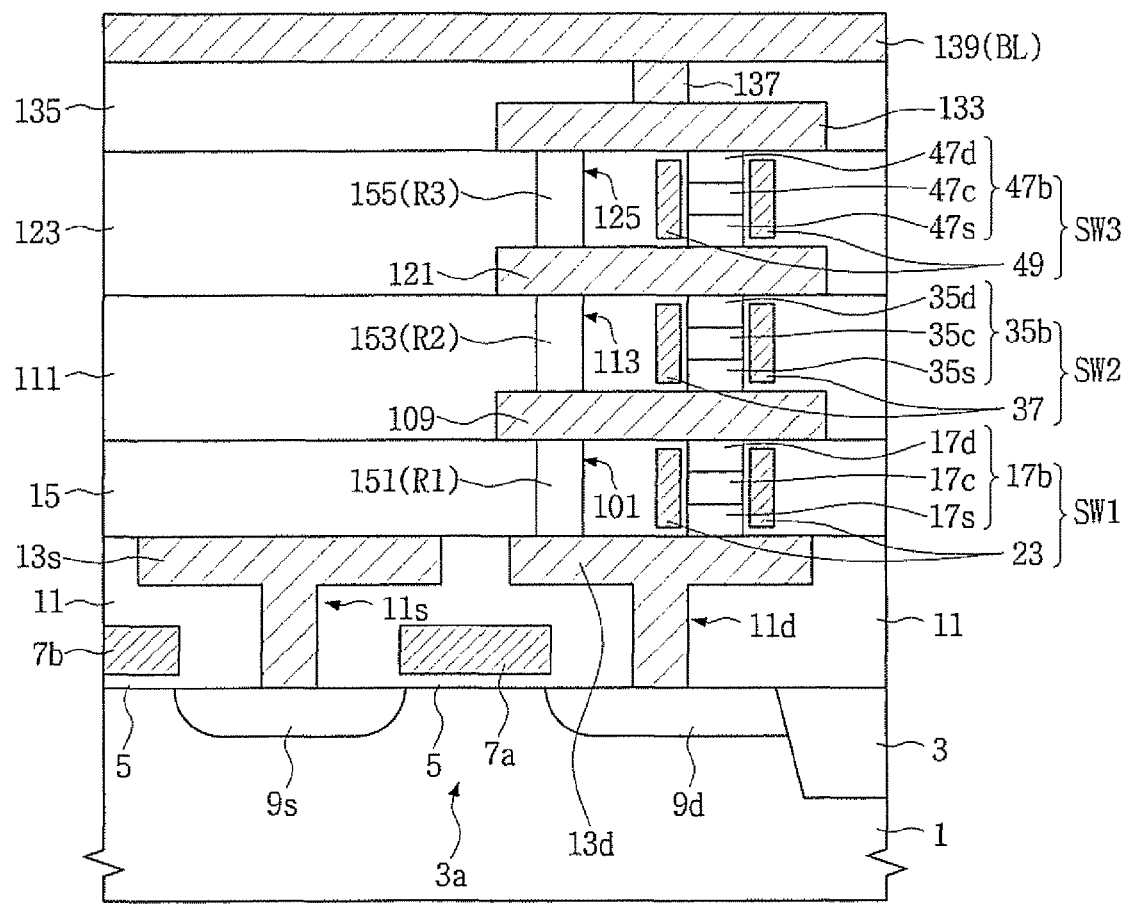
FIG. 5 is a cross-sectional view of a NAND-type resistive memory cell string having an equivalent circuit diagram as shown in FIG. 2.

FIG. 5 is a cross-sectional view of still another NAND-type resistive memory cell string having the equivalent circuit diagram of FIG. 2. The embodiment of FIG. 5 is different from the embodiment of FIG. 4 in terms of the type of data storage element. That is, according to the embodiment of FIG. 5, a first variable resistor 151 is provided instead of the first lower electrode 103, the first phase change material pattern 107, and the first insulating spacer 105 of FIG. 4, and a second variable resistor 153 is provided instead of the second lower electrode 115, the second phase change material pattern 119 and the second insulating spacer 117 of FIG. 4. Similarly, a third variable resistor 155 is provided instead of the third lower electrode 127, the third phase change material pattern 131, and the third insulating spacer 129 of FIG. 4. Consequently, the first, the second and the third variable resistors 151, 153 and 155 are connected in parallel to the first to the third switching devices SW1 to SW3, respectively.

Each of the first, the second and the third variable resistors 151, 153 and 155 may include a variable resistor that is used for a RRAM cell, e.g., a PCMO layer or a transition metal oxide layer. In contrast, the first, the second and the third variable resistors 151, 153 and 155 may be respective magnetic tunnel junction (MTJ) structures used for a MRAM cell. That is, the first, the second and the third variable resistors 151, 153 and 155 may each include a pinned layer, a tunnel insulating layer, and a free layer, which are sequentially stacked.

Methods of fabricating a NAND-type resistive memory cell string according to further embodiments of the present invention will be described below.

FIGS. 6A to 13A are plan views illustrating methods of fabricating the NAND-type resistive memory cell string illustrated in FIG. 3, and FIGS. 6B to 13B are cross-sectional views corresponding to FIGS. 6A to 13A, respectively.

Figure 6A:
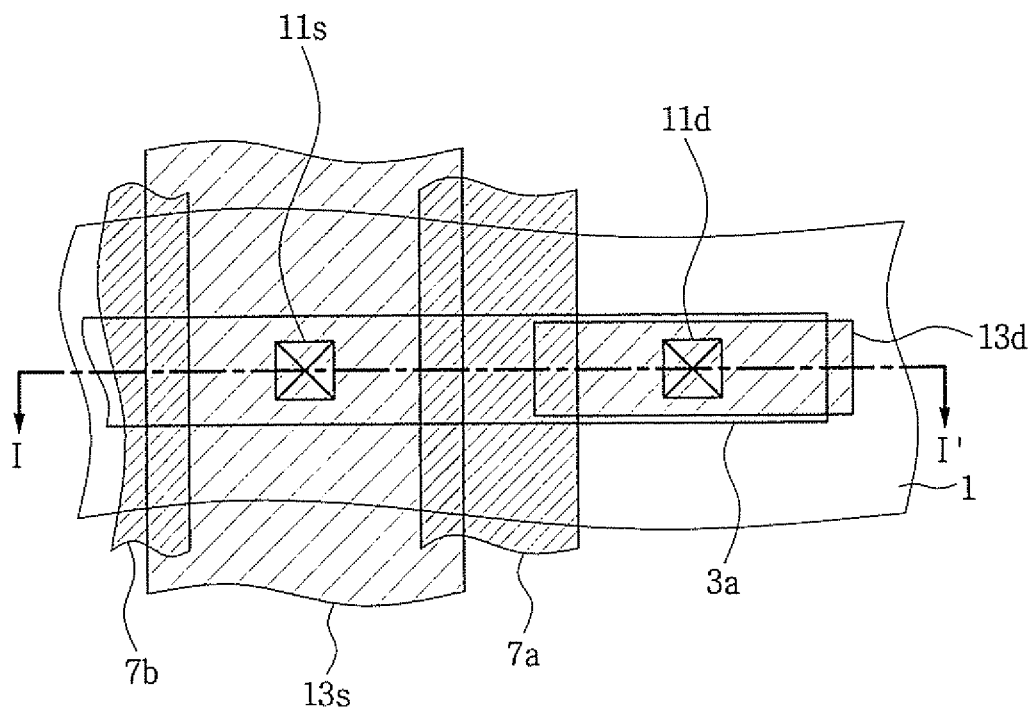
Figure 6B:
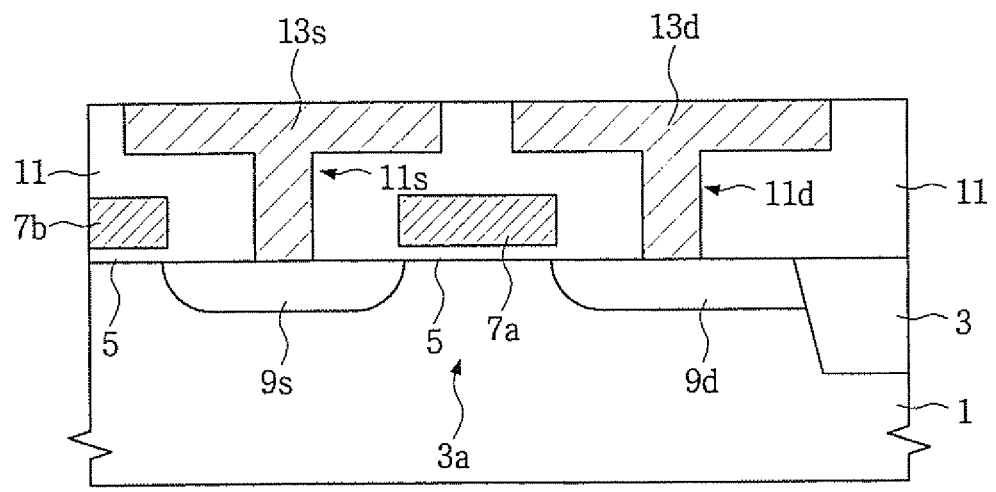

Referring to FIGS. 6A and 6B, an isolation layer 3 is formed in a predetermined region of a substrate 1 to define an active region 3a. A gate insulating layer 5 is formed on the active region, and a gate conductive layer is formed on the substrate having the gate insulating layer 5. The gate conductive layer is patterned to form main gate electrodes 7a and 7b that cross the active region 3a. Impurity ions are implanted into the active region 3a using the main gate electrodes 7a and 7b and the isolation layer 3 as ion implantation masks to form a main source region 9s and a main drain region 9d. The main gate electrode 7a, the main source 9s, and the main drain 9d define a main switching device (SW0 of FIG. 1).

A lower insulating layer 11 is formed on the substrate having the main switching device 7a, 9s and 9d. A common source line 13s and a drain pad 13d are formed in/on the lower insulating layer 11 using well known methods. The common source line 13s is formed to be in contact with the main source 9s through a source contact hole 11s passing through lower insulating layer 11, and the drain pad 13d is formed to be in contact with the main drain 9d through a drain contact hole 11d passing through the lower insulating layer 11. The main gate electrode 7a and the common source line 13s may be formed crossing the active region 3a as illustrated in FIG. 6A.

Figure 7A:
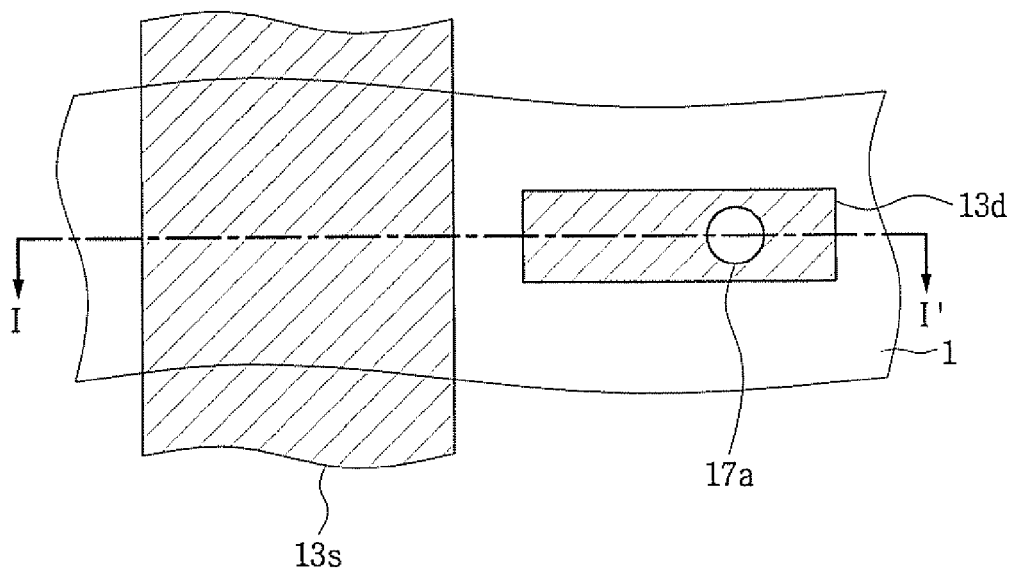
Figure 7B:
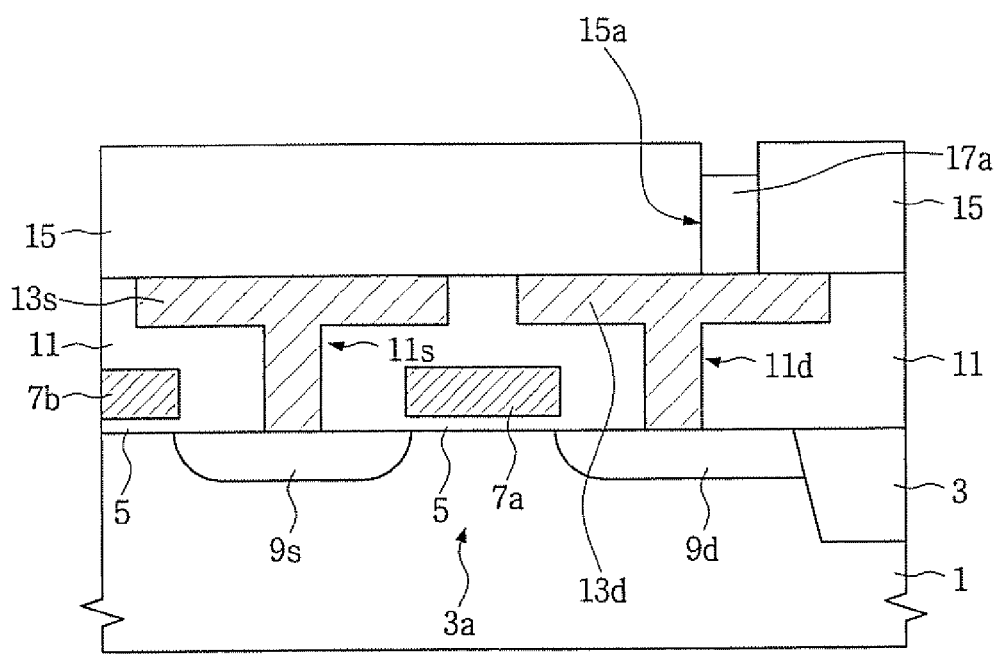

Referring to FIGS. 7A and 7B, a first insulating layer 15 is formed on the substrate having the common source line 13s and the drain pad 13d, and the first insulating layer 15 is patterned to form a first body hole 15a exposing a first region of the drain pad 13d. Then, a semiconductor layer, such as a silicon layer, is formed in the first body hole 15a and on the first insulating layer 15, and the semiconductor layer is planarized to expose an upper surface of the first insulating layer 15. As a result, a semiconductor pattern may be formed in the first body hole 15a. The semiconductor pattern is patterned to form a recessed semiconductor pattern 17a in the first body hole 15a. As illustrated in FIG. 7B, the recessed semiconductor pattern 17a may have an upper surface lower than that of the first insulating layer 15.

Figure 8A:
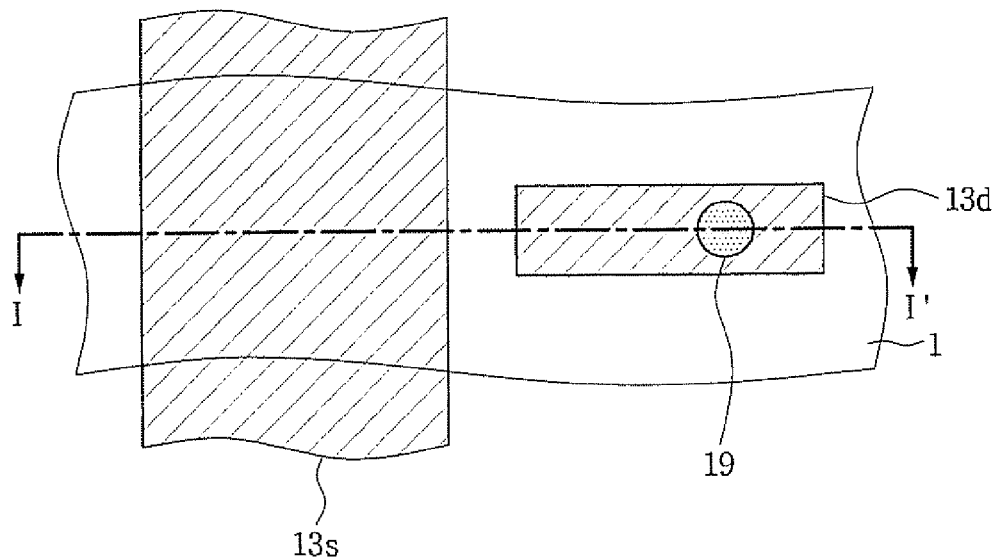
Figure 8B:
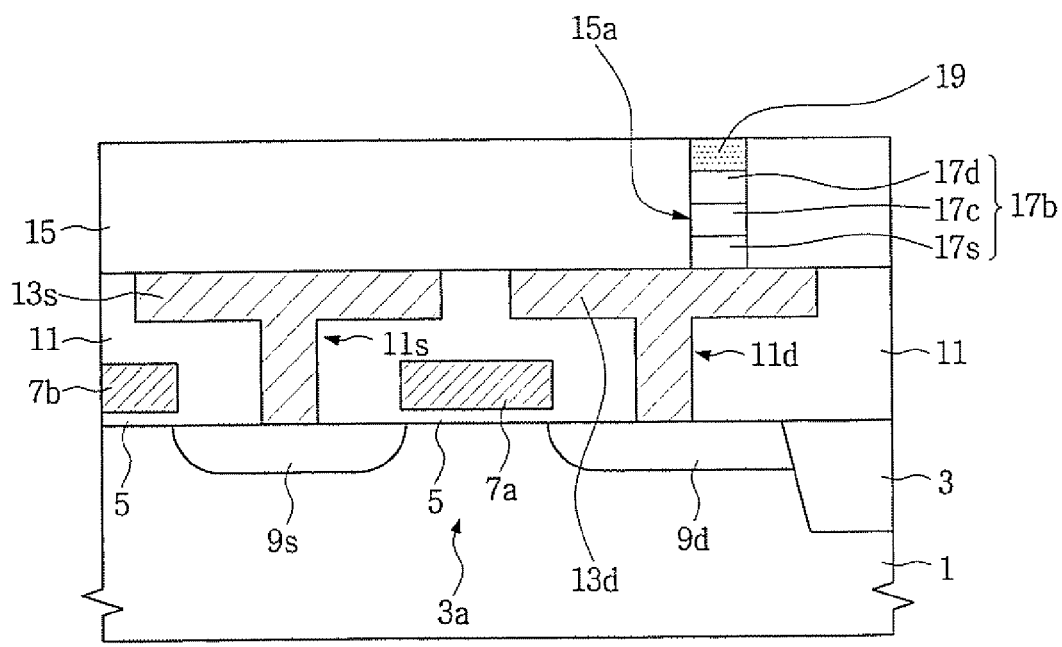

Referring to FIGS. 8A and 8B, impurity ions are implanted into the recessed semiconductor pattern 17a to form a first source 17s, a first channel 17c, and a first drain 17d, which are sequentially stacked. The first source 17s, the first channel 17c, and the first drain 17d define a first body pattern 17b. Then, a first body capping pattern 19 is formed in the first body hole 15a on the first body pattern 17b. The first body capping pattern 19 may be formed of a material layer having an etch selectivity with respect to the first insulating layer 15. For example, when the first insulating layer 15 is formed of a silicon oxide layer, the first body capping pattern 19 may be formed of an insulating layer such as a silicon nitride layer or a silicon oxynitride layer.

Figure 9A:
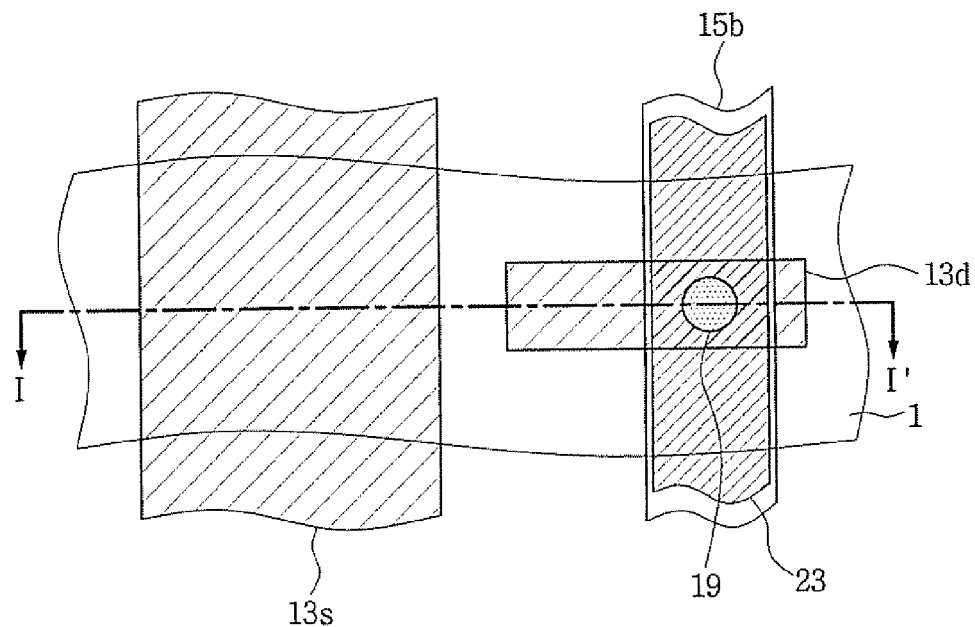
Figure 9B:
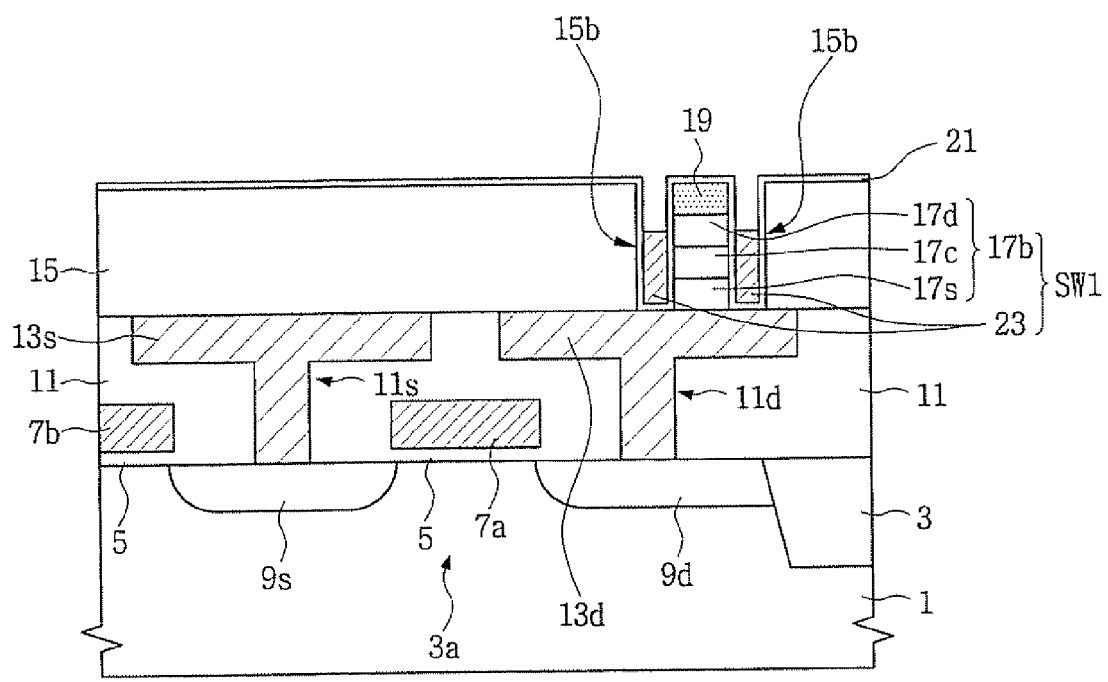

Referring to FIGS. 9A and 9B, the first insulating layer 15 is patterned to form a first groove 15b that exposes sidewalls of the first body pattern 17b and the first body capping pattern 19. As illustrated in FIG. 9A, the first groove 15b may be formed extending parallel to the common source line 13s. Also, the first groove 15b may be formed to expose at least sidewalls of the first channel 17c. That is, in some embodiments, the first groove 15b may be formed such that the drain pad 13d adjacent to the first source 17s is not exposed. In contrast, in other embodiments, the first groove 15b may be formed to expose the drain pad 13d adjacent to the first source 17s. In this case, the first groove 15b may expose sidewalls of the first source 17s, the first channel 17c, the first drain 17d and the first body capping pattern 19.

A first gate insulating layer 21 is formed on the substrate and in the first groove 15b. The first gate insulating layer 21 may be formed using well-known deposition techniques, such as a chemical vapor deposition (CVD) technique, an atomic layer deposition (ALD) technique, and/or a thermal oxidation technique. The first gate insulating layer 21 may be selectively formed on an exposed region of the drain pad 13d and/or on the sidewalls of the first body pattern 17b.

A gate conductive layer is formed on the first gate insulating layer 21, and the gate conductive layer is planarized to form a first gate electrode 23 in the first groove 15b. The first gate electrode 23 may be recessed to have an upper surface lower than that of the first insulating layer 15. More particularly, the first gate electrode 23 may be recessed to have an upper surface lower than that of the first drain 17d. The first gate electrode 23 and the first body pattern 17b define a first switching device SW1, i.e., a first vertical MOS transistor.

Figure 10A:
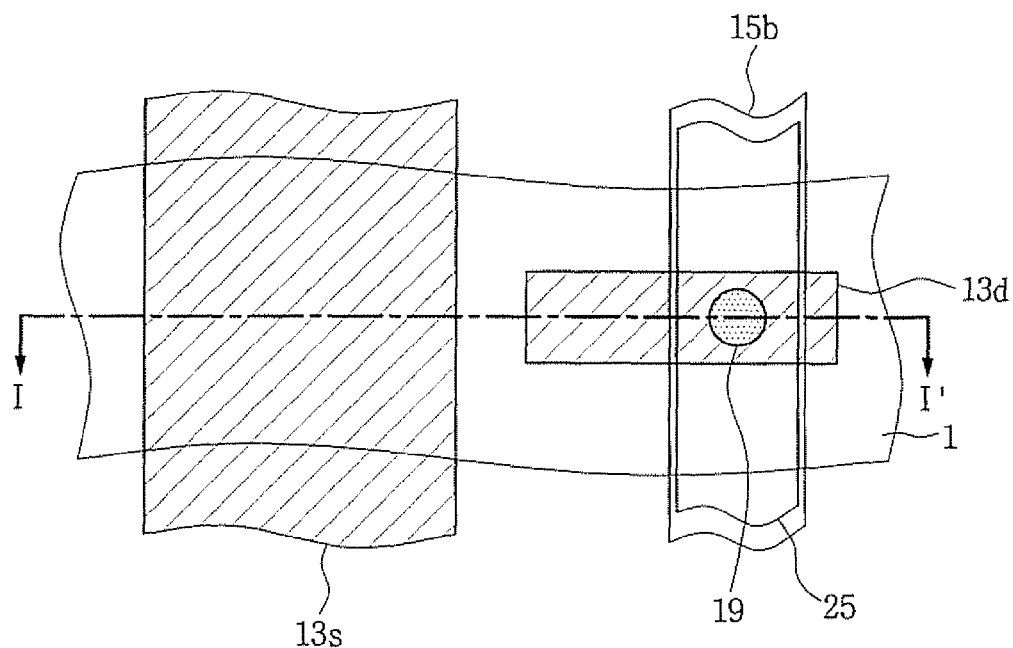
Figure 10B:
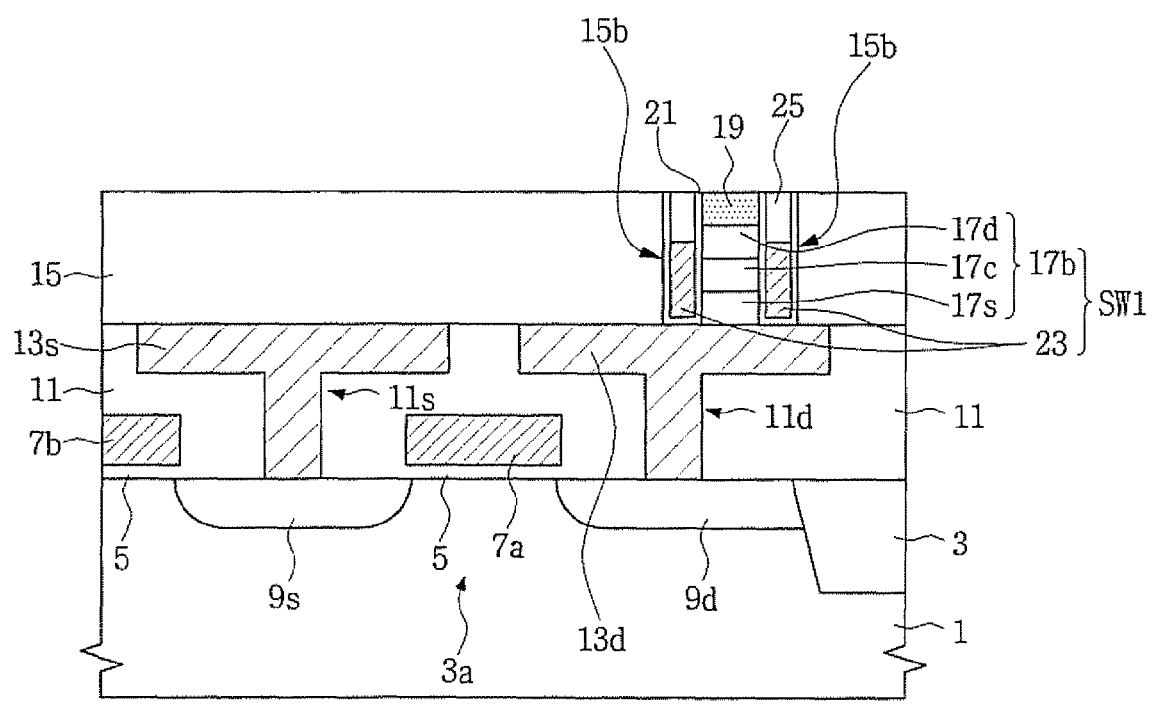

Referring to FIGS. 10A and 10B, a first gate capping insulating layer is formed on the substrate where the first gate electrode 23 is formed, and the first gate capping insulating layer is planarized to form a first gate capping pattern 25 remaining in the first groove 15b on the first gate electrode 23.

Figure 11A:
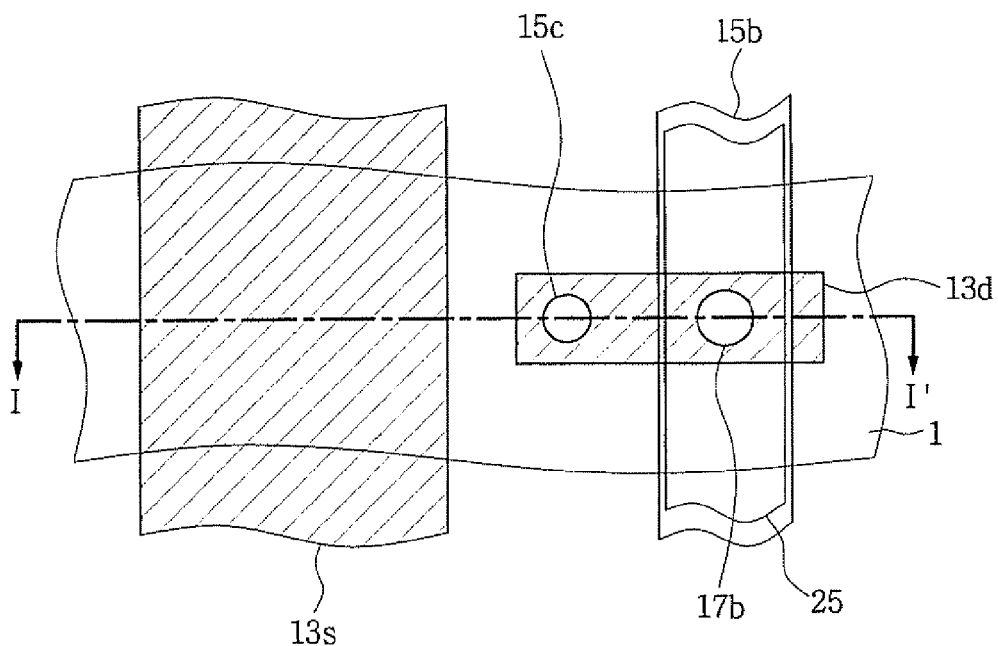
Figure 11B:
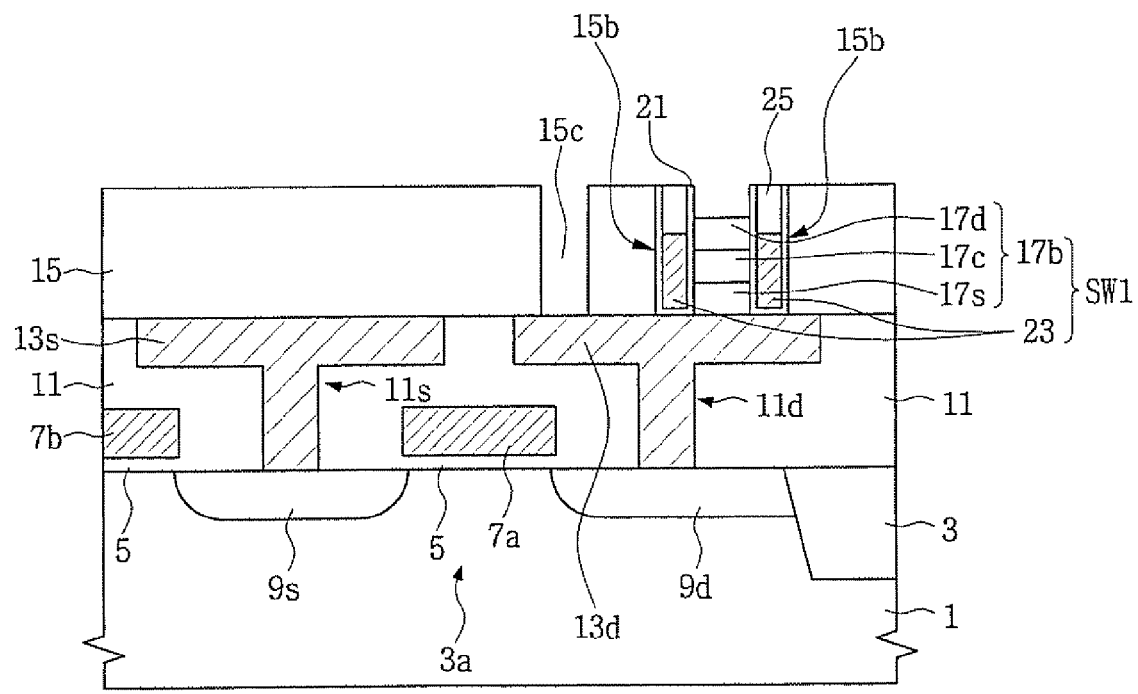

Referring to FIGS. 11A and 11B, the first body capping pattern 19 is removed to expose the first drain 17d, and the first insulating layer 15 is patterned to form a first hole 15c exposing a second region of the drain pad 13d and laterally spaced apart from the first body pattern 17b. The first body capping pattern 19 may be removed after the first hole 15c is formed in some embodiments.

Figure 12A:
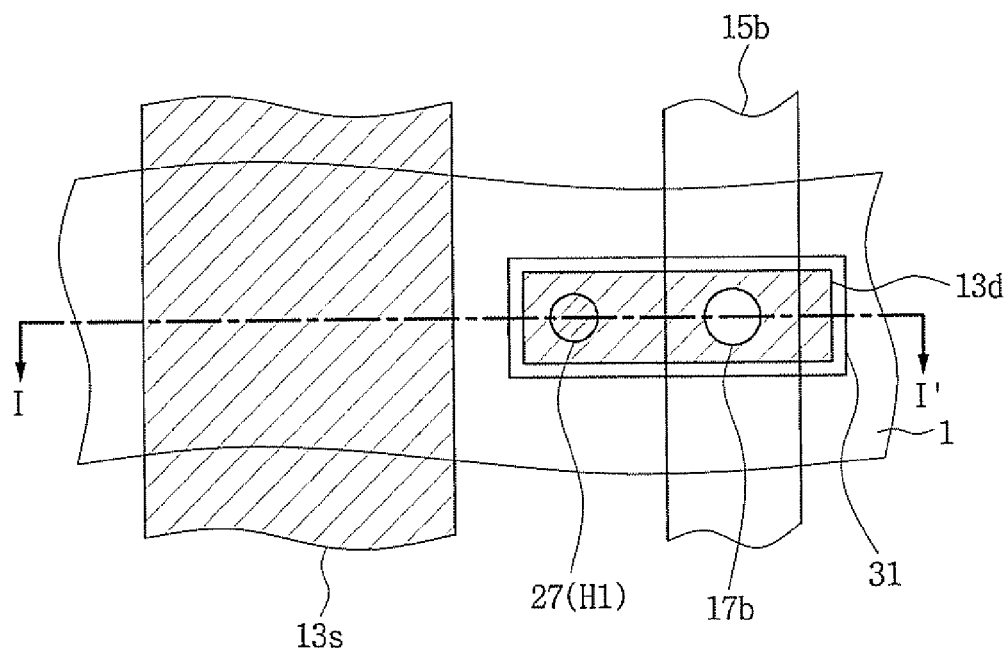
Figure 12B:
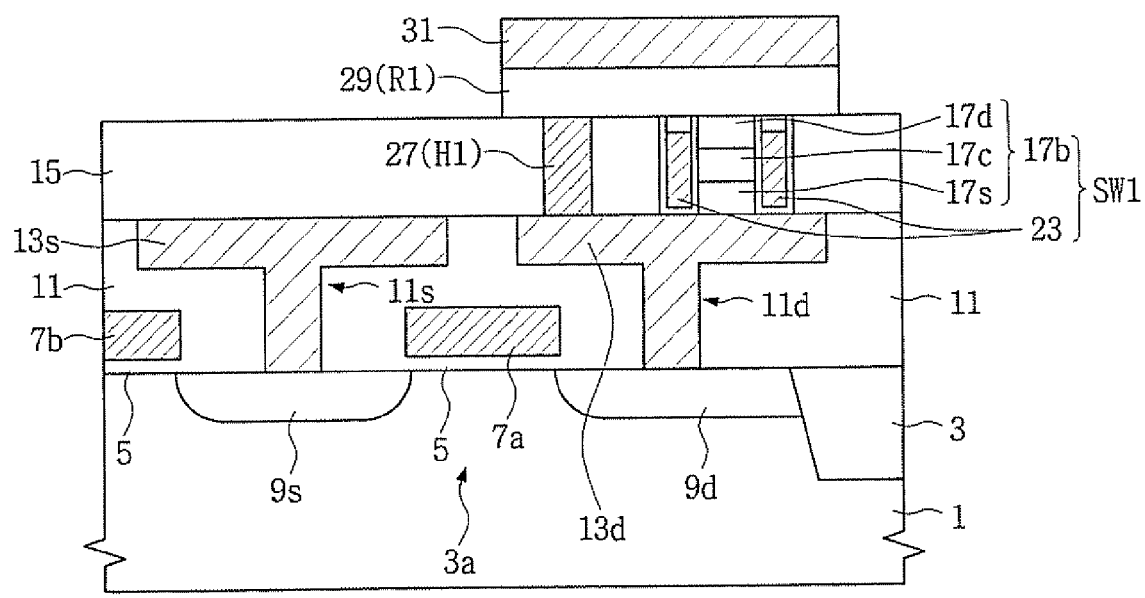

Referring to FIGS. 12A and 12B, a first lower electrode 27 is formed in the first hole 15c. The first lower electrode 27 may be formed by depositing a lower electrode layer, such as a titanium nitride (TiN) layer and/or a titanium aluminum nitride (TiAlN) layer, on the substrate having the first hole 15c and planarizing the lower electrode layer.

A variable resistor material layer and an upper electrode material layer are sequentially formed on the substrate having the first lower electrode 27, and the upper electrode material layer and the variable resistor material layer are patterned to form a first variable resistor 29 on the first lower electrode 27 and the first drain 17d and a first upper electrode 31 stacked on the first variable resistor 29. The variable resistor layer may be formed of a phase change material layer, such as a chalcogenide layer, and the upper electrode layer may be formed of a conductive layer, such as a titanium nitride (TiN) layer and/or a titanium aluminum nitride (TiAlN) layer. The first lower electrode 27, the first variable resistor 29, and the first upper electrode 31 define a first data storage element. Also, the first data storage element 27, 29 and 31 and the first switching device SW1 define a first resistive memory cell, i.e., a first phase change memory cell (corresponding to CL1 of FIG. 1).

Figure 13A:
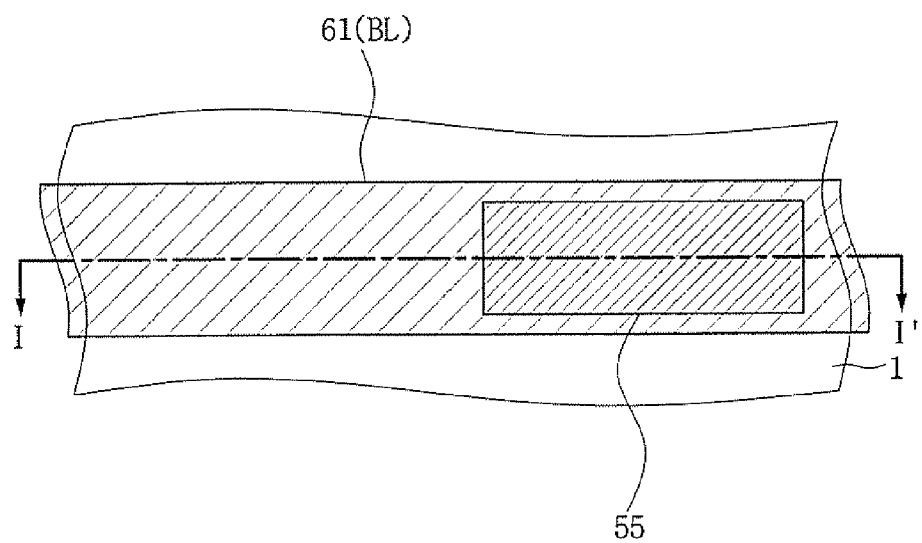
Figure 13B:
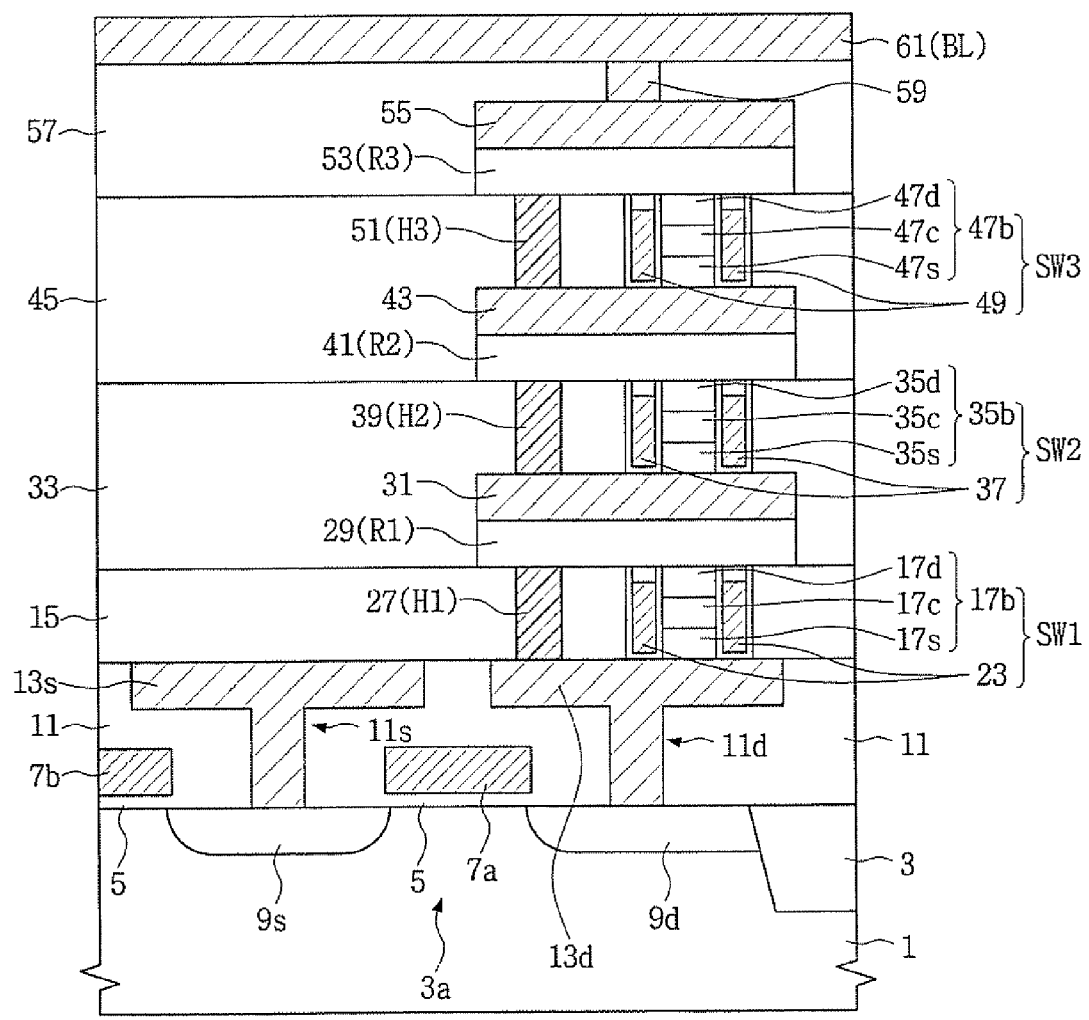

Referring to FIGS. 13A and 13B, a second insulating layer 33 is formed on the first upper electrode 31 and the first insulating layer 15, and a second switching device SW2 and a second lower electrode 39 are formed in the first insulating layer 33 using similar methods as described with reference to FIGS. 7A to 12B. A second variable resistor 41 on the second lower electrode 39 and the second switching device SW2 and a second upper electrode 43 stacked on the second variable resistor 41 are formed using similar methods as described with reference to FIGS. 12A and 12B. The second lower electrode 39, the second variable resistor 41, and the second upper electrode 43 define a second data storage element, and the second data storage element and the second switching device SW2 define a second resistive memory cell, i.e., a second phase memory cell (CL2 of FIG. 1).

A third insulating layer 45 is formed on the second resistive memory cell, and a third switching device SW3 and a third lower electrode 51 are formed in the third insulating layer 45 using similar methods as described with reference to FIGS. 7A to 12B. A third variable resistor 53 on the third lower electrode 51 and the third switching device SW3 and a third upper electrode 55 stacked on the third variable resistor 53 are formed using similar methods as described with reference to FIGS. 12A and 12B. The third lower electrode 51, the third variable resistor 53, and the third upper electrode 55 define a third data storage element, and the third data storage element 51, 53 and 55 and the third switching device SW3 define a third resistive memory cell, i.e., a third phase memory cell (CL3 of FIG. 1).

An upper insulating layer 57 is formed on the substrate having the third resistive memory cell, and a bit line contact plug 59 that is electrically connected to the third upper electrode 55 is formed in the upper insulating layer 57. A conductive layer such as a metal layer is formed on the substrate having the bit line contact plug 59, and the conductive layer is patterned to form a bit line 61 on the bit line contact plug 59. The bit line 61 may be formed to cross the main gate electrode 7a in a plan view.

FIGS. 14 to 17 are cross-sectional views illustrating a method of fabricating the NAND-type resistive memory cell string illustrated in FIG. 4.

Figure 14:
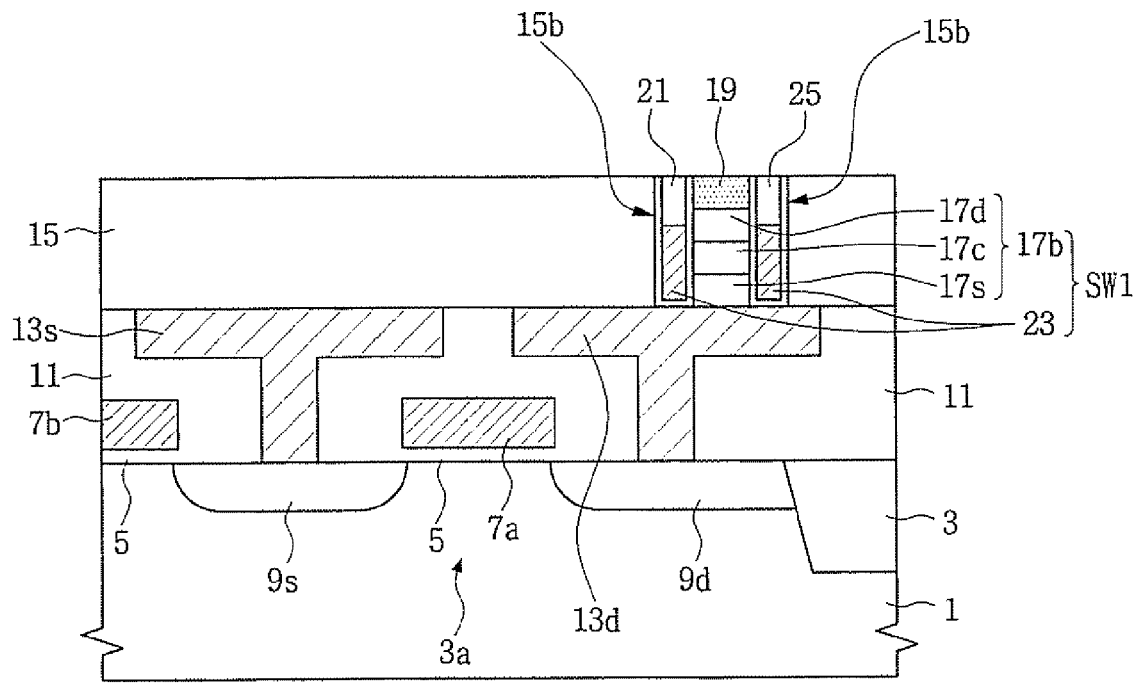
FIGS. 14 to 17 are cross-sectional views illustrating methods of fabricating the NAND-type resistive memory cell string illustrated in FIG. 4.
Figure 15:
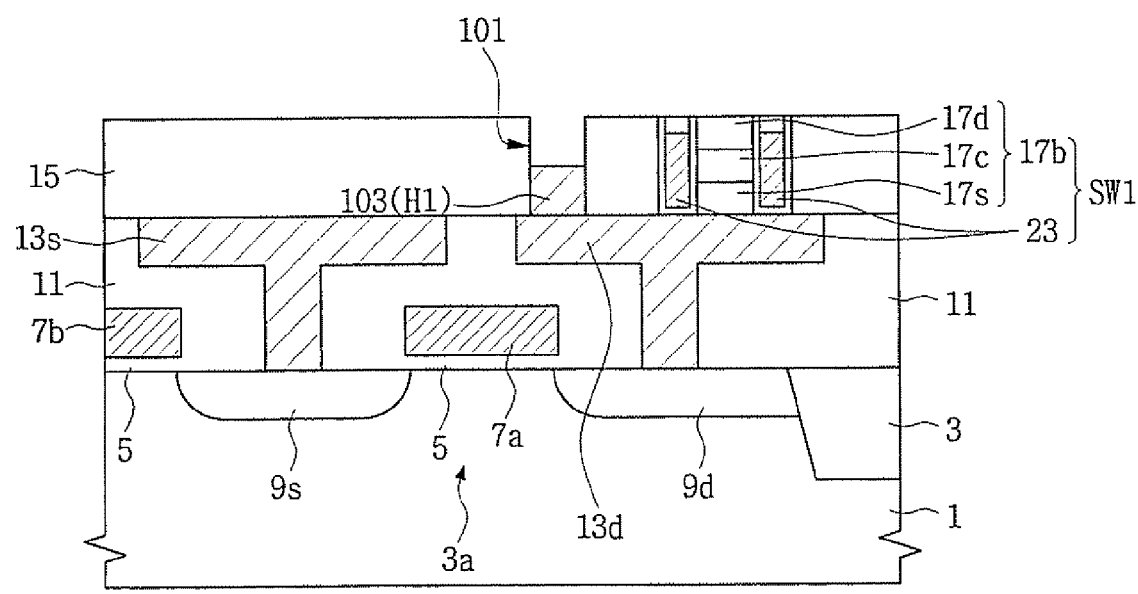

Referring to FIGS. 14 and 15, a main switching device 7a, 9s and 9d, a lower insulating layer 11, a common source line 13s, a drain pad 13d, a first insulating layer 15, and a first switching device SW1 are formed on a semiconductor substrate 1 using similar methods as described with reference to FIGS. 6A to 10B. The first insulating layer 15 is patterned to form a first hole 101 exposing a predetermined region of the drain pad 13d and a first lower electrode 103 is formed in the first hole 101. A first body capping pattern 19 on the first body pattern 17b of the first switching device SW1 may be removed before or after the first hole 101 is formed. The first lower electrode 103 may be formed of a conductive layer, such as a TiN layer or a TiAlN layer. Also, the first lower electrode 103 may be recessed such that it may have an upper surface lower than that of the first insulating layer 15.

Figure 16:
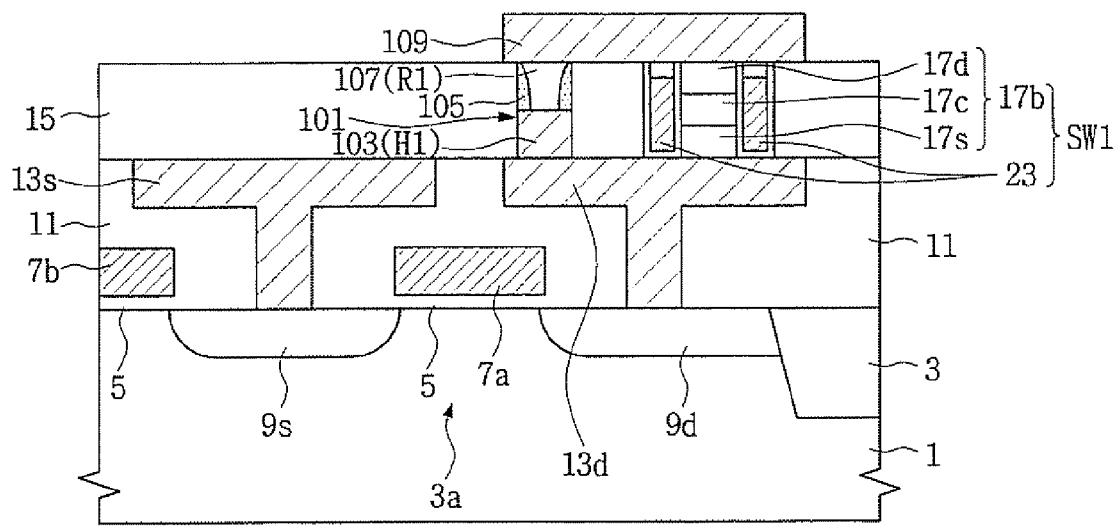

Referring to FIG. 16, a first insulating spacer 105 may be formed on sidewalls of the first hole 101 on the first lower electrode 103. The first insulating spacer 105 may be formed of a material layer having an etch selectivity with respect to the first insulating layer 15. For example, when the first insulating layer 15 is formed of a silicon oxide layer, the first insulating spacer 105 may be formed of a silicon nitride layer and/or a silicon oxynitride layer. A variable resistor layer is formed on the substrate and in the first hole 101 having the first insulating spacer 105 therein, and the variable resistor layer is planarized to form a first variable resistor 107 in the first hole 101 surrounded by the first insulating spacer 105. The variable resistor layer may be formed of a phase change material layer, such as a chalcogenide layer. Consequently, the first variable resistor 107 may be self-aligned with the first lower electrode 103 by the first hole 101, and may be formed to have a confined shape.

An upper electrode layer is formed on the substrate having the first variable resistor 107, and the upper electrode layer is patterned to form a first upper electrode 109 on the first variable resistor 107 and the first drain 17d. The upper electrode layer may be formed of a conductive layer, such as a TiN layer or a TiAlN layer.

The first lower electrode 103, the first variable resistor 107 and the first upper electrode 109 define a first data storage element, and the first data storage element 103, 107 and 109 and the first switching device SW1 define a first resistive memory cell, i.e., a first phase change memory cell (corresponding to CL1 of FIG. 1).

Figure 17:
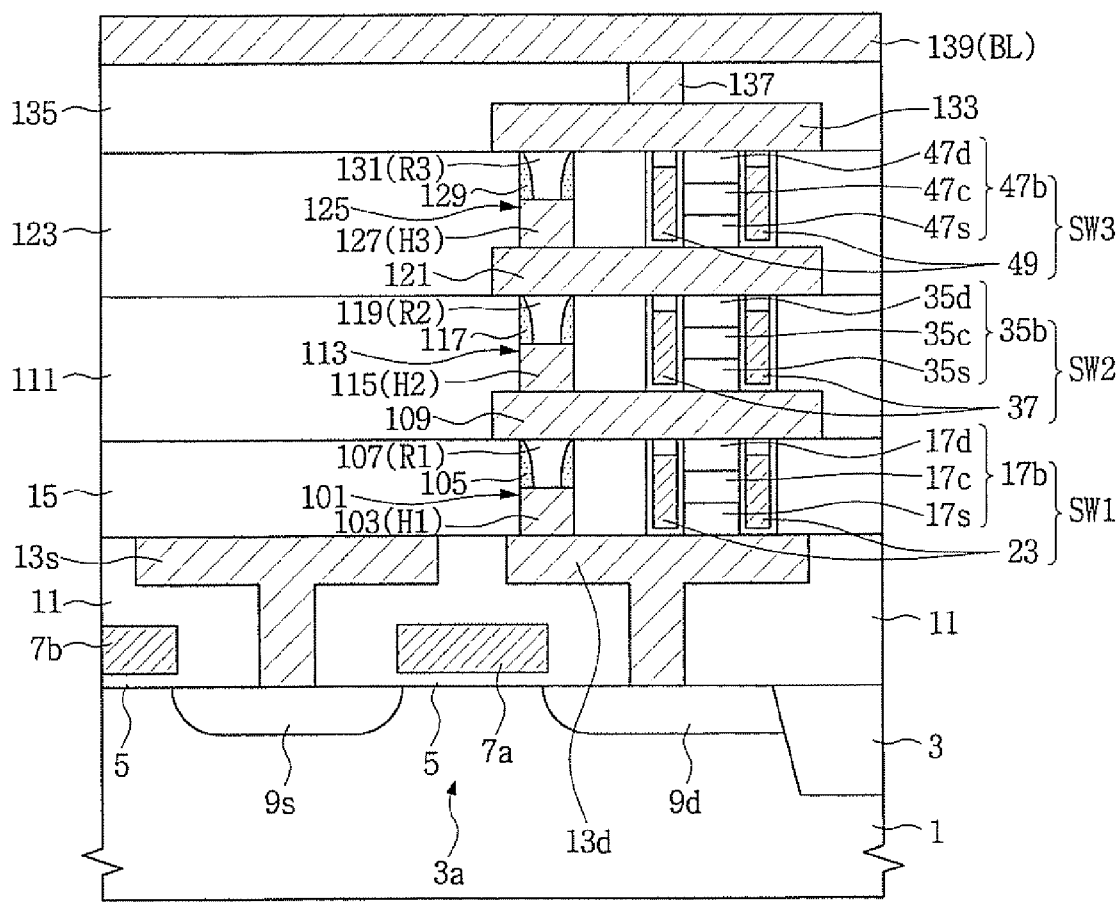

Referring to FIG. 17, a second insulating layer 111 is formed on the substrate having the first upper electrode 109, and a second switching device SW2 is formed in the second insulating layer 111 using similar methods as described with reference to FIG. 14. The second insulating layer 111 is patterned to form a second hole 113 exposing a predetermined region of the first upper electrode 109, and a second lower electrode 115, a second insulating spacer 117, and a second variable resistor 119 are formed in the second hole 113 using similar methods as described with reference with FIGS. 15 and 16. A second upper electrode 121 is formed on the second variable resistor 119 and the second drain 35d.

The second lower electrode 115, the second variable resistor 119, and the second upper electrode 121 define a second data storage element, and the second data element 115, 119 and 121 and the second switching device SW2 define a second resistive memory cell, i.e., a second phase change memory cell (CL2 of FIG. 1).

A third insulating layer 123 is formed on the second upper electrode 121 and the second insulating layer 111, and a third switching device SW3 is formed in the third insulating layer 123 using similar methods as described with reference to FIG. 14. The third insulating layer 123 is patterned to form a third hole 125 exposing a predetermined region of the second upper electrode 121, and a third lower electrode 127, a third insulating spacer 129, and a third variable resistor 131 are formed in the third hole 125 using similar methods as described with reference to FIGS. 15 and 16. A third upper electrode 133 is formed on the third variable resistor 131 and a third drain 47d.

The third lower electrode 127, the third variable resistor 131, and the third upper electrode 133 define a third data storage element, and the third data storage element 127, 131 and 133 and the third switching device SW3 define a third resistive memory cell, i.e., a third phase change memory cell (corresponding to CL3 of FIG. 1).

An upper insulating layer 135 is formed on the third upper electrode 133 and the third insulating layer 123, and a bit line 139 is formed on the upper insulating layer 135. The bit line 139 may be electrically connected to the third upper electrode 133 through a bit line contact plug 137 extending through the upper insulating layer 135. The bit line 139 may be formed using similar methods as described with reference to FIGS. 13A and 13B.

A method of fabricating the NAND-type resistive memory cell string illustrated in FIG. 5 is different from that of the embodiments described with reference to FIGS. 14 to 17, in particular, with respect to fabricating first to third variable resistors 151, 153 and 155. That is, each of the first to the third variable resistors 151, 153 and 155 may be formed of a variable resistor used for a RRAM cell, e.g., a praseodymium calcium manganese oxide (PCMO) layer and/or a transition metal oxide layer. Alternatively, each of the first, the second, and the third variable resistors 151, 153 and 155 may be manufactured using a method of fabricating a magnetic tunnel junction (MTJ) structure used for a general MRAM cell. That is, each of the first, the second, and the third variable resistors 151, 153 and 155 may be formed to include a pinned layer, a tunneling insulating layer and a free layer, which are sequentially stacked.

According to the above-described embodiments, a plurality of serially-connected resistive memory cells are vertically stacked on a semiconductor substrate, and each of the resistive memory cells is formed to include a data storage element including a variable resistor and a switching device that is connected in parallel to the data storage element. Therefore, integration density of a NAND-type resistive memory cell string of a non-volatile memory device can be improved.

Embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

That which is claimed:

1. A non-volatile memory device, comprising:
a substrate;
an insulating layer on the substrate;
a plurality of serially connected resistive memory cells stacked in the insulating layer such that a first one of the plurality of resistive memory cells is on the substrate and a next one of the plurality of resistive memory cells is on the first one of the plurality of resistive memory cells to define a NAND-type resistive memory cell string; and
a bit line on the insulating layer and electrically connected to a last one of the plurality of resistive memory cells,
wherein at least one of the plurality of resistive memory cells comprises:
a switching device including a body pattern comprising a source region, a channel region, and a drain region stacked in the insulating layer, and a gate electrode on a sidewall of the body pattern; and
a data storage element connected in parallel with the switching device, the data storage element comprising a lower electrode spaced apart from the body pattern of the switching device, a variable resistor on the lower electrode, and an upper electrode on the variable resistor,
wherein the upper electrode of the first one of the plurality of resistive memory cells is on the lower electrode and the body pattern of the next one of the plurality of resistive memory cells in the NAND type memory cell string.

2. The non-volatile memory device of claim 1, further comprising:
a bit line contact plug on the upper electrode of the last one of the plurality of resistive memory cells,
wherein the bit line is directly connected to the upper electrode of the last one of the plurality of resistive memory cells by the bit line contact plug.

3. The non-volatile memory device of claim 1, wherein the gate electrode of the switching device comprises a word line in the insulating layer extending substantially perpendicular to the bit line.

4. The non-volatile memory device of claim 1, wherein the variable resistor comprises a phase change material layer that is configured to transition between an amorphous state and a crystalline state responsive to heat applied thereto via the lower electrode.

5. The non-volatile memory device of claim 1, further comprising:
a main switching device on the substrate, wherein the main switching device is electrically connected to the first one of the plurality of resistive memory cells.

6. The non-volatile memory device of claim 5, wherein the main switching device comprises:
a main source region and a main drain region in the substrate; and
a main gate electrode on the substrate between the main source and the main drain region,
wherein the main drain region is electrically connected to the lower electrode and the body pattern of the first one of the plurality of resistive memory cells.

7. The non-volatile memory device of claim 1, wherein the gate electrode of the switching device is on opposing sidewalls of the body pattern.

8. The non-volatile memory device of claim 7, wherein the variable resistor and the lower electrode are confined within a contact hole in the insulating layer.

9. The non-volatile memory device of claim 8, further comprising:
an insulating spacer between sidewalls of the contact hole and the variable resistor.

10. A non-volatile memory device, comprising:
a substrate;
an insulating layer on the substrate;
a plurality of serially connected resistive memory cells stacked in the insulating layer such that a first one of the plurality of resistive memory cells is on the substrate and a next one of the plurality of resistive memory cells is on the first one of the plurality of resistive memory cells to define a NAND-type resistive memory cell string; and
a bit line on the insulating layer and electrically connected to a last one of the plurality of resistive memory cells,
wherein at least one of the plurality of resistive memory cells comprises:
a switching device including a body pattern comprising a source region, a channel region, and a drain region stacked in the insulating layer, and a gate electrode on a sidewall of the body pattern;
a variable resistor spaced apart from the switching device; and
an upper electrode on the variable resistor and the drain region of the switching device, and
wherein the upper electrode of the first one of the plurality of resistive memory cells electrically connects the variable resistor and the drain region of the first one of the plurality of resistive memory cells with the variable resistor and the source region of the next one of the plurality of resistive memory cells in the NAND-type resistive memory cell string.

11. The non-volatile memory device of claim 10, wherein the variable resistor comprises one of a praseodymium calcium manganese oxide (PCMO) layer and a transition metal oxide layer.

12. The non-volatile memory device of claim 11, wherein the variable resistor comprises a magnetic tunnel junction (MTJ) structure including a pinned layer, a tunneling insulating layer and a free layer, which are sequentially stacked.

13. A method of fabricating a non-volatile memory device, the method comprising:
forming an insulating layer on a substrate;
forming a plurality of serially connected resistive memory cells stacked in the insulating layer such that a first one of the plurality of resistive memory cells is on the substrate and a next one of the plurality of resistive memory cells is on the first one of the plurality of resistive memory cells to define NAND-type resistive memory cell string; and
forming a bit line on the insulating layer and electrically connected to a last one of the plurality of resistive memory cells,
wherein forming at least one of the plurality of resistive memory cells comprises:
forming an interlayer insulating layer on the substrate;
forming a switching device in the interlayer insulating layer including a body pattern comprising a source region, a channel region, and a drain region stacked in the interlayer insulating layer; and
forming a data storage element in the interlayer insulating later and electrically connected between the source region and the drain region of the switching device,
wherein forming the switching device comprises:
patterning the interlayer insulating layer to define an opening therein;
forming the body pattern in the opening in the interlayer insulating layer;

implanting impurity ions into the body pattern to define the source region, the channel region, and the drain region stacked in the opening in the interlayer insulating layer; and forming a gate electrode on a sidewall of the body pattern.

14. The method of claim 13, wherein forming the gate electrode comprises:

etching the interlayer insulating layer to form a groove exposing the sidewall of the body pattern;

forming a gate insulating layer on the exposed sidewall of the body pattern; and forming the gate electrode in the groove on the gate insulating layer.

15. The method of claim 13, further comprising the following before forming the insulating layer:

forming a main source region and a main drain region in the substrate; and forming a main gate electrode on the substrate between the source region and the drain region to define a main switching device, wherein forming the plurality of resistive memory cells comprises forming the first one of the plurality of resistive memory cells on the main switching device such that the source region thereof is electrically connected to the main drain region of the main switching device.

16. A method of fabricating a non-volatile memory device, the method comprising:

forming an insulating layer on a substrate;

forming a plurality of serially connected resistive memory cells stacked in the insulating layer such that a first one of the plurality of resistive memory cells is on the substrate and a next one of the plurality of resistive memory cells is on the first one of the plurality of resistive memory cells to define NAND-type resistive memory cell string; and forming a bit line on the insulating layer and electrically connected to a last one of the plurality of resistive memory cells, wherein forming at least one of the plurality of resistive memory cells comprises:

forming an interlayer insulating layer on the substrate;

forming a switching device in the interlayer insulating layer including a body pattern comprising a source region, a channel region, and a drain region stacked in the interlayer insulating layer; and forming a data storage element in the interlayer insulating later and electrically connected between the source region and the drain region of the switching device, wherein forming the data storage element comprises:

forming an opening extending through the interlayer insulating layer;

forming a lower electrode in the opening;

forming a variable resistor on the lower electrode; and forming an upper electrode on the variable resistor, wherein the upper electrode of the first one of the plurality of resistive memory cells is on the lower electrode and the body pattern of the next one of the plurality of resistive memory cells in the NAND-type resistive memory cell string.

17. The method of claim 16, wherein the variable resistor comprises a phase change material layer that is configured to transition between an amorphous state and a crystalline state responsive to heat applied thereto via the lower electrode.

18. The method of claim 16, further comprising:

forming a bit line contact plug on the upper electrode of the last one of the plurality of resistive memory cells, wherein the bit line is directly connected to the upper electrode of the last one of the plurality of resistive memory cells by the bit line contact plug.

19. The method of claim 16, wherein forming the data storage element comprises:

forming the variable resistor on the lower electrode in the opening in the interlayer insulating layer such that the variable resistor is confined therein; and forming the upper electrode on the variable resistor and the body pattern.

20. The method of claim 19, further comprising:

forming an insulating spacer on sidewalls of the opening in the interlayer insulating layer before forming the variable resistor therein.

21. A method of fabricating a non-volatile memory device, the method comprising:

forming an insulating layer on a substrate;

forming a plurality of serially connected resistive memory cells stacked in the insulating layer such that a first one of the plurality of resistive memory cells is on the substrate and a next one of the plurality of resistive memory cells is on the first one of the plurality of resistive memory cells to define NAND-type resistive memory cell string; and forming a bit line on the insulating layer and electrically connected to a last one of the plurality of resistive memory cells, wherein forming at least one of the plurality of resistive memory cells comprises:

forming an interlayer insulating layer on the substrate;

forming a switching device in the interlayer insulating layer including a body pattern comprising a source region, re ion, a channel region, and a drain region stacked in the interlayer insulating layer; and forming a data storage element in the interlayer insulating later and electrically connected between the source region and the drain region of the switching device, wherein forming the data storage element comprises:

forming a contact hole extending through the interlayer insulating layer;

forming a variable resistor in the hole; and forming an upper electrode on the variable resistor and the body pattern.

22. The method of claim 21, wherein the variable resistor comprises one of a praseodymium calcium manganese oxide layer and a transition metal oxide layer.

23. The method of claim 21, wherein the variable resistor comprises a magnetic tunnel junction structure including a pinned layer, a tunneling insulating layer and a free layer, which are sequentially stacked.

* * * * *